(12) United States Patent
Thompson et al.

(10) Patent No.: US 7,893,352 B2
(45) Date of Patent: Feb. 22, 2011

(54) ORGANIC PHOTOSENSITIVE OPTOELECTRONIC DEVICE HAVING A PHENANTHROLINE EXCITON BLOCKING LAYER

(75) Inventors: Mark E. Thompson, Anaheim Hills, CA (US); Jian Li, Los Angeles, CA (US); Stephen Forrest, Princeton, NJ (US); Barry Rand, Princeton, NJ (US)

(73) Assignees: The Trustees of Princeton University, Princeton, NJ (US); The University of Southern California, Los Angeles, CA (US)

( * ) Notice: Subject to any disclaimer, the term of this patent is extended or adjusted under 35 U.S.C. 154(b) by 1066 days.

(21) Appl. No.: 11/286,228

(22) Filed: Nov. 22, 2005

(65) Prior Publication Data
US 2006/0138453 A1    Jun. 29, 2006

Related U.S. Application Data

(60) Provisional application No. 60/630,629, filed on Nov. 24, 2004.

(51) Int. Cl.
*H01L 31/00* (2006.01)
(52) U.S. Cl. .................................................. 136/263
(58) Field of Classification Search .................. 136/263
See application file for complete search history.

(56) References Cited

U.S. PATENT DOCUMENTS

| | | | |
|---|---|---|---|
| 6,333,458 B1 | 12/2001 | Forrest et al. | |
| 6,352,777 B1 | 3/2002 | Bulovic et al. | |
| 6,420,031 B1 | 7/2002 | Parthasarathy et al. | |
| 6,440,769 B2 | 8/2002 | Peumans et al. | |
| 6,451,415 B1 | 9/2002 | Forrest et al. | |
| 6,524,728 B1 | 2/2003 | Kijima et al. | |
| 6,580,027 B2 | 6/2003 | Forrest et al. | |
| 6,657,378 B2 | 12/2003 | Forrest et al. | |
| 7,196,835 B2 | 3/2007 | Peumans et al. | |
| 7,375,370 B2 | 5/2008 | Forrest et al. | |
| 2002/0150837 A1 | 10/2002 | Oyamada et al. | |
| 2005/0110007 A1 | 5/2005 | Forrest et al. | |
| 2005/0224113 A1 | 10/2005 | Xue et al. | |
| 2006/0032529 A1 | 2/2006 | Rand et al. | |

FOREIGN PATENT DOCUMENTS

| | | |
|---|---|---|
| EP | 1 097 981 | 5/2001 |
| WO | WO 02/101838 | 12/2002 |

OTHER PUBLICATIONS

Forrest et al., U.S. Appl. No. 10/979,145, filed Nov. 3, 2004.

(Continued)

*Primary Examiner*—Jeffrey T Barton
(74) *Attorney, Agent, or Firm*—Finnegan, Henderson, Farabow, Garrett & Dunner, L.L.P.

(57) ABSTRACT

An organic photosensitive optoelectronic device, having an anode, a cathode, and an organic blocking layer between the anode and the cathode is described, wherein the blocking layer comprises a phenanthroline derivative, and at least partially blocks at least one of excitons, electrons, and holes.

21 Claims, 21 Drawing Sheets

OTHER PUBLICATIONS

Miessler and Tarr, "Inorganic Chemistry," ($2^{nd}$ Edition), Prentice Hall, 1999.

Peumans et al., U.S. Appl. No. 10/857,747, filed Jun. 1, 2004.

Peumans et al., "Efficient photon harvesting at high optical intensities in ultrathin organic double-heterostructure photovoltaic diodes," Appl. Phys. Lett., vol. 76, pp. 2650-2652, 2000.

Rand et al., U.S. Appl. No. 10/915,410, filed Aug. 11, 2004.

Ahn et al., "Photovoltaic properties of polymer-based solar cells", Synthetic Metals Elsevier Switzerland 137(1-3): 1447-1448, Apr. 4, 2003.

Fostiropoulos et al., "Preparation and investigation of phthalocyanine/C60 solar cells", Proceedings of the Spie, 4801: 1-6, Jul. 11, 2002.

Heutz et al., "Influence of molecular architecture and intermixing on the photovoltaic, morphological and spectroscopic properties of CuPc-C60 heterojunctions", Solar Energy Materials and Solar Cells 83(2-3): 229-245, Jun. 15, 2004.

Peumans et al., "Very-high-efficiency double-heterostructure copper phthalocyanine/C60 photovoltaic cells", Appl. Phys. Lett. 79(1): 126-128, Jul. 2, 2001.

European Patent Office Action for 058575903-1235, dated Sep. 17, 2007.

Katsuyuki Naito, "Quantitative Relations between Glass Transition Temperatures and Thermodynamic Parameters for Various Materials: Molecular Design for Nonpolymeric Organic Dye Glasses with Thermal Stability," Chem. Mater 1994, 6: 2343-2350.

Katsuyuki Naito et al., "Molecule Design for Nonpolymeric Organic Dye Glasses with Thermal Stability: Relations between Thermodynamic Parameters and Amorphous Properties," J. Phys. Chem. 1993, 97: 6240-6248.

ORGANIC PHOTOSENSITIVE OPTOELECTRONIC DEVICE HAVING A PHENANTHROLINE EXCITON BLOCKING LAYER

RELATED APPLICATIONS

This application claims benefit of U.S. Provisional Patent Application No. 60/630,629, file Nov. 24, 2004, which is incorporated herein in its entirety.

UNITED STATES GOVERNMENT RIGHTS

This invention was made with U.S. Government support under Contract No. 339-6002 awarded by the U.S. Air Force Office of Scientific Research and under Contract No. 341-4141 awarded by U.S. Department of Energy, National Renewable Energy Laboratory. The government has certain rights in this invention.

JOINT RESEARCH AGREEMENT

The claimed invention was made by, on behalf of, and/or in connection with one or more of the following parties to a joint university-corporation research agreement: Princeton University, The University of Southern California, and Global Photonic Energy Corporation. The agreement was in effect on and before the date the claimed invention was made, and the claimed invention was made as a result of activities undertaken within the scope of the agreement.

FIELD OF INVENTION

The present invention generally relates to organic photosensitive optoelectronic devices. More specifically, it is directed to organic photosensitive optoelectronic devices, e.g., solar cells and visible spectrum photodetectors, having an exciton blocking layer, comprising a phenanthroline derivative.

BACKGROUND OF THE INVENTION

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction, as defined below, is present, and, also, according to whether the device is operated with an external applied voltage, also known as a bias or bias voltage. A photoconductor cell does not have a rectifying junction, and is normally operated with a bias. A PV device has at least one rectifying junction, and is operated with no bias. A photodetector has at least one rectifying junction, and is usually, but not always, operated with a bias.

As used herein, the term "rectifying" denotes, inter alia, that an interface has an asymmetric conduction characteristic, i.e., the interface supports electronic charge transport preferably in one direction. The term "semiconductor" denotes materials that can conduct electricity when charge carriers are induced by thermal or electromagnetic excitation. The term "photoconductive" generally relates to the process in which electromagnetic radiant energy is absorbed, and, thereby, converted to excitation energy of electric charge carriers, so that the carriers can conduct (i.e., transport) electric charge in a material. The term "photoconductive material" refers to semiconductor materials that are utilized for their property of absorbing electromagnetic radiation to generate electric charge carriers. As used herein, "top" means furthest away from the substrate, while "bottom" means closest to the substrate. There may be intervening layers, unless it is specified that the first layer is "in physical contact with" the second layer.

When electromagnetic radiation of an appropriate energy is incident upon an organic semiconductor material, a photon can be absorbed to produce an excited molecular state. In organic photoconductive materials, the generated molecular state is generally believed to be an "exciton," i.e., an electron-hole pair in a bound state that is transported as a quasi-particle. An exciton can have an appreciable life-time before geminate recombination ("quenching"), which refers to the original electron and hole recombining with each other (as opposed to recombination with holes or electrons from other pairs). To produce a photocurrent, the electron and hole forming the exciton are typically separated at a rectifying junction.

In the case of photosensitive devices, the rectifying junction is referred to as a photovoltaic heterojunction. Types of organic photovoltaic heterojunctions include a donor-acceptor heterojunction, formed at an interface of a donor material and an acceptor material, and a Schottky-barrier heterojunction, formed at the interface of a photoconductive material and a metal.

FIG. 1 is an energy-level diagram illustrating an example of a donor-acceptor heterojunction. In the context of organic materials, the terms "donor" and "acceptor" refer to the relative positions of the Highest Occupied Molecular Orbital ("HOMO") and Lowest Unoccupied Molecular Orbital ("LUMO") energy levels of two contacting, but different, organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material.

As used herein, a first HOMO or LUMO energy level is "greater than" or "higher than" a second HOMO or LUMO energy level if the first energy level is closer to the vacuum energy level 10. A higher HOMO energy level corresponds to an ionization potential ("IP") having a smaller absolute energy relative to a vacuum level. Similarly, a higher LUMO energy level corresponds to an electron affinity ("EA") having a smaller absolute energy relative to vacuum level. On a conventional energy level diagram, with the vacuum level at the top, the LUMO energy level of a material is higher than the HOMO energy level of the same material.

After absorption of a photon 6 in the donor 152 or the acceptor 154 creates an exciton 8, the exciton 8 disassociates at the rectifying interface. The donor 152 transports the hole (open circle) and the acceptor 154 transports the electron (dark circle).

A significant property in organic semiconductors is carrier mobility. Mobility measures the ease with which a charge carrier can move through a conducting material in response to an electric field. In the context of organic photosensitive devices, a material that conducts preferentially by electrons due to a high electron mobility may be referred to as an electron transport material. A material that conducts preferentially by holes due to a high hole mobility may be referred to as a hole transport material. A layer that conducts preferentially by electrons, due to mobility and/or position in the device, may be referred to as an electron transport layer ("ETL"). A layer that conducts preferentially by holes, due to mobility and/or position in the device, may be referred to as a hole transport layer ("HTL"). Preferably, but not necessarily, an acceptor material is an electron transport material and a donor material is a hole transport material.

How to pair two organic photoconductive materials to serve as a donor and an acceptor in a photovoltaic heterojunction based upon carrier mobilities and relative HOMO and LUMO levels is well known in the art, and is not addressed here.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule." In general, a small molecule has a defined chemical formula with a molecular weight that is the same from molecule to molecule, whereas a polymer has a defined chemical formula with a molecular weight that may vary from molecule to molecule. As used herein, "organic" includes metal complexes of hydrocarbyl and heteroatom-substituted hydrocarbyl ligands.

For additional background explanation and description of the state of the art for organic photosensitive devices, including their general construction, characteristics, materials, and features, U.S. Pat. No. 6,657,378 to Forrest et al., U.S. Pat. No. 6,580,027 to Forrest et al., and U.S. Pat. No. 6,352,777 to Bulovic et al. are incorporated herein by reference.

SUMMARY OF THE INVENTION

The present invention is directed to organic photosensitive optoelectronic devices, comprising an anode, a cathode, and an organic blocking layer between the anode and the cathode, wherein the blocking layer comprises a phenanthroline derivative, and at least partially blocks at least one of excitons, electrons, and holes. Preferably, the blocking layer is an exciton blocking layer. The phenanthroline derivative is selected preferably from the group consisting of mono-t-BBP, mono-PBP, mono-o-TBP, mono-XYBP, n-BBP, t-BBP, PBP, o-TBP, m-TBP, and P(o-T)BP.

The organic photosensitive optoelectronic device of the invention is preferably a solar cell or photodetector, such as a solar spectrum photodetector or a visible spectrum photodetector. The organic photosensitive optoelectronic device of the invention may comprise stacked organic photosensitive optoelectronic devices.

Preferably, the organic photosensitive optoelectronic device of the invention further comprises a photosensitive heterojunction, which is, more preferably, a donor/acceptor heterojunction. Preferably, the EBL is positioned between the photosensitive heterostructure and one of the anode and the electrode. In a preferred embodiment, the organic photosensitive optoelectronic device of the invention further comprises a photosensitive heterostructure, a first EBL between the photosensitive heterostructure and the anode, and a second EBL between the photosensitive heterostructure and the cathode.

The EBL of the organic photosensitive optoelectronic device of the invention may be adjacent to the anode or the cathode. Organic photosensitive optoelectronic devices of the invention may also comprise a first EBL adjacent to the anode and a second EBL adjacent to the cathode. Moreover, organic photosensitive optoelectronic devices of the invention may also comprise an ETL, where the blocking layer is positioned between the ETL and one of the anode and the cathode. For example, the blocking layer may be positioned between the ETL and the cathode, and the device further may further comprise a HTL between the anode and the ETL, where the blocking layer is preferably an exciton blocking layer. Preferred ETL materials include $C_{60}$.

Preferably the phenanthroline derivative of the organic photosensitive optoelectronic device of the invention has the structure

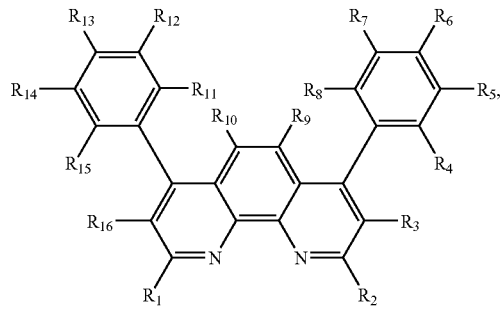

wherein $R_1$ to $R_{16}$ are hydrogen, alkyl, phenyl, or substituted phenyl, with the proviso that $R_1$ and $R_2$ are not both hydrogen and are not both methyl when $R_3$ to $R_{16}$ are all hydrogen.

In one embodiment, the organic photosensitive optoelectronic device of the invention comprises an electron transport layer, a hole transport layer, and the blocking layer, which are disposed between two parallel planar reflective surfaces, which form a waveguide. Preferably, one of the two reflective surfaces has an aperture to admit light incident upon the device. The organic photosensitive optoelectronic device of that embodiment may further comprise a transparent portion between the two reflective surfaces, such that light is admitted to the device from a direction substantially parallel to the planes of the reflective surfaces.

A plurality of the organic photosensitive optoelectronic device of the invention may also be stacked to form a stacked organic photosensitive optoelectronic device.

The present invention provides organic photosensitive optoelectronic devices and organic photosensitive optoelectronic device subcells comprising one or more phenanthroline derivative exciton blocking layers to increase the internal quantum efficiency of the organic photosensitive optoelectronic device or subcell. The organic photosensitive optoelectronic devices of the invention are capable of operating at a high external quantum efficiency, and may comprise stacked subcells. Preferably, a stacked organic photosensitive optoelectronic device of the invention is capable of operating with an external quantum efficiency that approaches the maximum internal quantum efficiency of an optimal subcell. Organic photosensitive optoelectronic devices of the invention to have improved $V_{oc}$ and $I_{sc}$ compared to devices that do not comprise exciton blocking layers. Substrates of the organic photosensitive optoelectronic devices of the invention may be conductive or insulating, and may be rigid or flexible.

DETAILED DESCRIPTION

Figure 1:
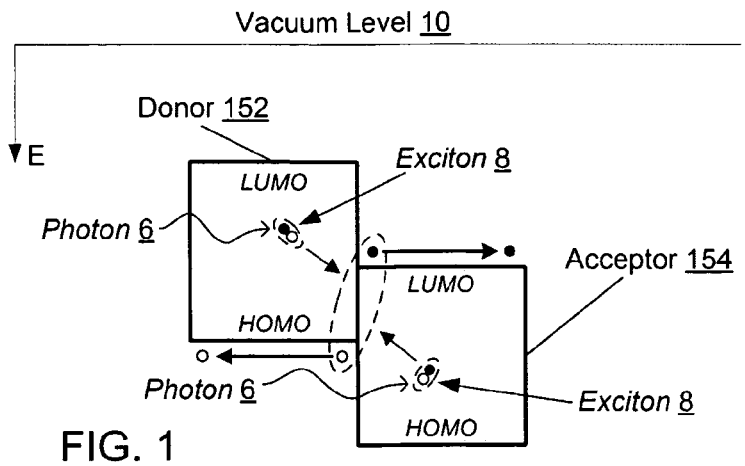
FIG. 1 is an energy level diagram illustrating a donor-acceptor heterojunction.
Figure 2:
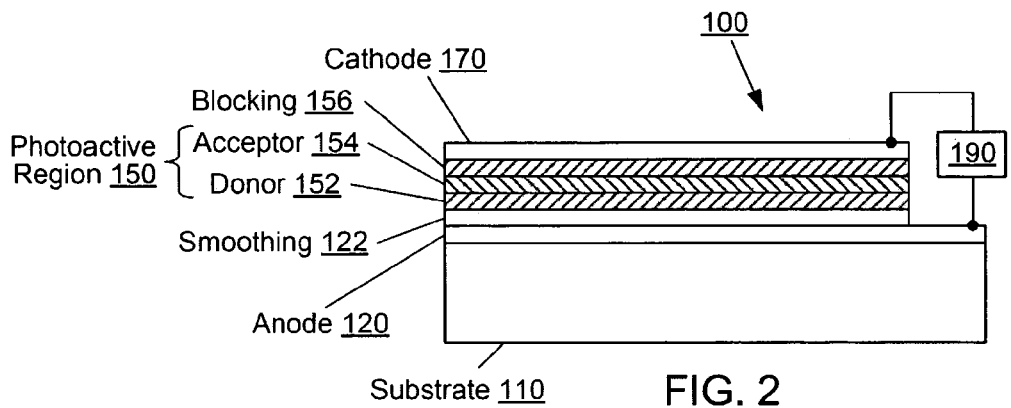
FIG. 2 illustrates an organic photosensitive device including a donor-acceptor heterojunction.

An organic photosensitive device comprises at least one photoactive region in which light is absorbed to form an exciton, which may subsequently dissociate into an electron and a hole. FIG. 2 shows an example of an organic photosensitive optoelectronic device 100 in which the photoactive region 150 comprises a donor-acceptor heterojunction. The "photoactive region" is a portion of a photosensitive device that absorbs electromagnetic radiation to generate excitons that may dissociate in order to generate an electrical current. Device 100 comprises an anode 120, an anode smoothing layer 122, a donor 152, an acceptor 154, an exciton blocking layer ("EBL") 156, and a cathode 170, over a substrate 110.

Examples of EBL 156 are described in U.S. Pat. No. 6,451,415 to Forrest et al., which is incorporated herein by reference. Additional background explanation of EBLs may also be found in Peumans et al., "Efficient photon harvesting at high optical intensities in ultrathin organic double-heterostructure photovoltaic diodes," *Applied Physics Letters* 76, 2650-52 (2000). EBLs reduce quenching by preventing excitons from migrating out of the donor and/or acceptor materials.

The terms "electrode" and "contact" are used interchangeably herein to refer to a layer that provides a medium for delivering photo-generated current to an external circuit or providing a bias current or voltage to the device. As illustrated in FIG. 2, anode 120 and cathode 170 are examples. Electrodes may be composed of metals or "metal substitutes." Herein the term "metal" is used to embrace both materials composed of an elementally pure metal, and also metal alloys which are materials composed of two or more elementally pure metals. The term "metal substitute" refers to a material that is not a metal within the normal definition, but which has metal-like properties, e.g., conductivity, such as doped wide-bandgap semiconductors, degenerate semiconductors, conducting oxides, and conductive polymers. Electrodes may comprise a single layer or multiple layers (a "compound" electrode), may be transparent, semi-transparent, or opaque. Examples of electrodes and electrode materials include those disclosed in U.S. Pat. No. 6,352,777 to Bulovic et al., and U.S. Pat. No. 6,420,031, to Parthasarathy, et al., each incorporated herein by reference for disclosure of these respective features. As used herein, a layer is said to be "transparent" if it transmits at least 50% of the ambient electromagnetic radiation in a relevant wavelength.

The substrate 110 may be any suitable substrate that provides desired structural properties. The substrate may be flexible or rigid, planar or non-planar. The substrate may be transparent, translucent or opaque. Rigid plastics and glass are examples of preferred rigid substrate materials. Flexible plastics and metal foils are examples of preferred flexible substrate materials.

An anode-smoothing layer 122 may be situated between the anode layer 120 and the donor layer 152. Anode-smoothing layers are described in U.S. Pat. No. 6,657,378 to Forrest et al., incorporated herein by reference for its disclosure related to this feature.

In FIG. 2, the photoactive region 150 comprises the donor material 152 and the acceptor material 154. Organic materials for use in the photoactive region may include organometallic compounds, including cyclometallated organometallic compounds. The term "organometallic" as used herein is as generally understood by one of ordinary skill in the art and as given, for example, in Chapter 13 of "Inorganic Chemistry" (2nd Edition) by Gary L. Miessler and Donald A. Tarr, Prentice Hall (1999).

Organic layers may be fabricated using vacuum deposition, spin coating, organic vapor-phase deposition, inkjet printing and other methods known in the art.

Figure 3:
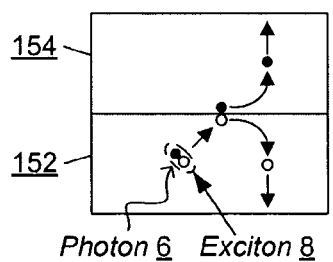
FIG. 3 illustrates a donor-acceptor bilayer forming a planar heterojunction.
Figure 4:
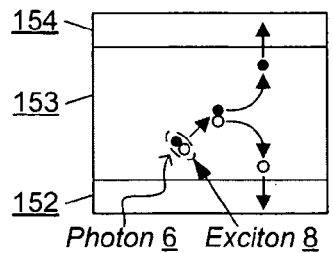
FIG. 4 illustrates a hybrid heterojunction including a mixed heterojunction between a donor layer and an acceptor layer.
Figure 5:
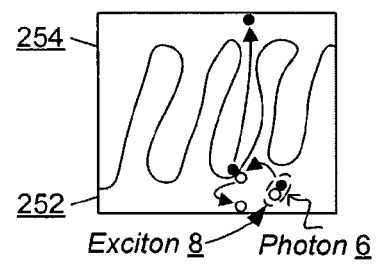
FIG. 5 illustrates a bulk heterojunction.

Examples of various types of donor-acceptor heterojunctions are shown in FIGS. 3, 4, and 5. FIG. 3 illustrates a donor-acceptor bilayer forming a planar heterojunction. FIG. 4 illustrates a hybrid heterojunction, including a mixed heterojunction 153, comprising a mixture of donor and acceptor materials. FIG. 5 illustrates an idealized "bulk" heterojunction. A bulk heterojunction, in the ideal photocurrent case, has a single continuous interface between the donor material 252 and the acceptor material 254, although multiple interfaces typically exist in actual devices. Mixed and bulk heterojunctions can have multiple donor-acceptor interfaces as a result of having plural domains of material. Domains that are surrounded by the opposite-type material (e.g., a domain of donor material surrounded by acceptor material) may be electrically isolated, such that these domains do not contribute to photocurrent. Other domains may be connected by percolation pathways (continuous photocurrent pathways), such that these other domains may contribute to photocurrent. The distinction between a mixed and a bulk heterojunction lies in degrees of phase separation between donor and acceptor materials. In a mixed heterojunction, there is very little or no phase separation (the domains are very small, e.g., less than a few nanometers), whereas in a bulk heterojunction, there is significant phase separation (e.g., forming domains with sizes of a few nanometers to 100 nm).

Small-molecule mixed heterojunctions may be formed, for example, by co-deposition of the donor and acceptor materials using vacuum deposition or vapor deposition. Small-molecule bulk heterojunctions may be formed, for example, by controlled growth, co-deposition with post-deposition annealing, or solution processing. Polymer mixed or bulk heterojunctions may be formed, for example, by solution processing of polymer blends of donor and acceptor materials.

If a photoactive region includes a mixed layer (153) or bulk layers (252, 254) and one or both of the donor (152) and acceptor layers (154), the photoactive region is said to include a "hybrid" heterojunction. The arrangement of layers in FIG. 4 is an example. For additional explanation of hybrid heterojunctions, Published U.S. Patent Application 2005/0224113 A1, entitled "High efficiency organic photovoltaic cells employing hybridized mixed-planar heterojunctions" by Jiangeng Xue et al., published Oct. 13, 2005, is hereby incorporated by reference.

In general, planar heterojunctions have good carrier conduction, but poor exciton dissociation; a mixed layer has poor carrier conduction and good exciton dissociation, and a bulk heterojunction has good carrier conduction and good exciton dissociation, but may experience charge build-up at the end of the material "cul-de-sacs," lowering efficiency. Unless otherwise stated, planar, mixed, bulk, and hybrid heterojunctions may be used interchangeably as donor-acceptor heterojunctions throughout the embodiments disclosed herein.

Figure 6:
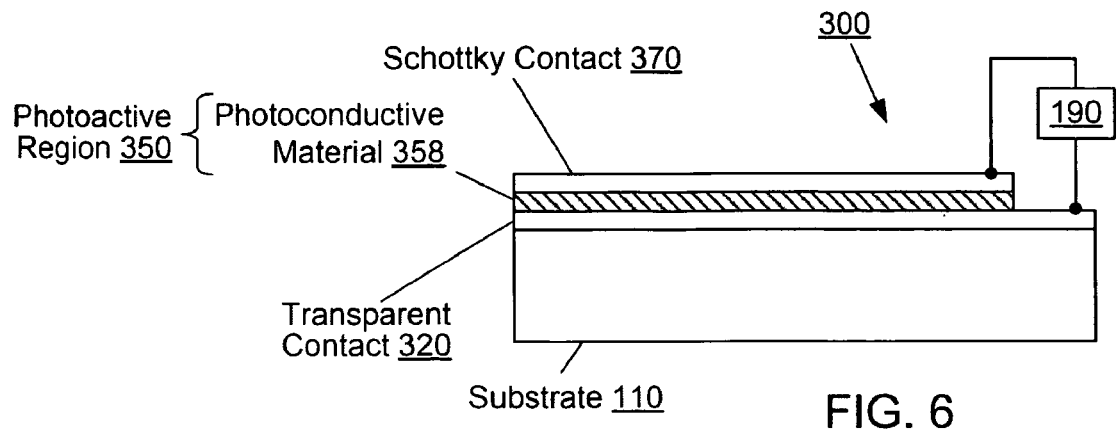
FIG. 6 illustrates an organic photosensitive device including a Schottky-barrier heterojunction.

FIG. 6 shows an example of an organic photosensitive optoelectronic device 300 in which the photoactive region 350 is part of a Schottky-barrier heterojunction. Device 300 comprises a transparent contact 320, a photoactive region 350 comprising an organic photoconductive material 358, and a Schottky contact 370. The Schottky contact 370 is typically formed as a metal layer. If the photoconductive layer 358 is an ETL, a high work function metal such as gold may be used, whereas if the photoconductive layer is an HTL, a low work function metal such as aluminum, magnesium, or indium may be used. In a Schottky-barrier cell, a built-in electric field associated with the Schottky barrier pulls the electron and hole in an exciton apart. Generally, this field-assisted exciton dissociation is not as efficient as the disassociation at a donor-acceptor interface.

The devices, as illustrated, may be connected to an element 190. If the device is a photovoltaic device, element 190 is a resistive load that consumes or stores power. If the device is a photodetector, element 190 is a current detecting circuit that measures the current generated when the photodetector is exposed to light, and may apply a bias to the device (as described, for example, in Published U.S. Patent Application 2005-0110007 A1, published May 26, 2005 to Forrest et al.). If the rectifying junction is eliminated from the device (e.g., using a single photoconductive material as the photoactive region), the resulting structures may be used as a photoconductor cell, in which case the element 190 is a signal detection circuit to monitor changes in resistance across the device due to the absorption of light. Unless otherwise stated, each of these arrangements and modifications may be used for the devices in each of the drawings and embodiments disclosed herein.

An organic photosensitive optoelectronic device may also comprise transparent charge transfer layers, electrodes, or charge recombination zones. A charge transfer layer may be organic or inorganic, and may or may not be photoconductively active. A charge transfer layer is similar to an electrode, but does not have an electrical connection external to the device, and only delivers charge carriers from one subsection of an optoelectronic device to the adjacent subsection. A charge recombination zone is similar to a charge transfer layer, but allows for the recombination of electrons and holes between adjacent subsections of an optoelectronic device. A charge recombination zone may include semi-transparent metal or metal substitute recombination centers comprising nanoclusters, nanoparticles, and/or nanorods, as described for example in U.S. Pat. No. 6,657,378 to Forrest et al.; U.S. patent application Ser. No. 10/915,410 entitled "Organic Photosensitive Devices" by Rand et al., filed Aug. 11, 2004; and U.S. patent application Ser. No. 10/979,145 entitled "Stacked Organic Photosensitive Devices" by Forrest et al., filed Nov. 3, 2004; each incorporated herein by reference for its disclosure of recombination zone materials and structures. A charge recombination zone may or may not include a transparent matrix layer in which the recombination centers are embedded. A charge transfer layer, electrode, or charge recombination zone may serve as a cathode and/or an anode of subsections of the optoelectronic device. An electrode or charge transfer layer may serve as a Schottky contact.

Figure 7:
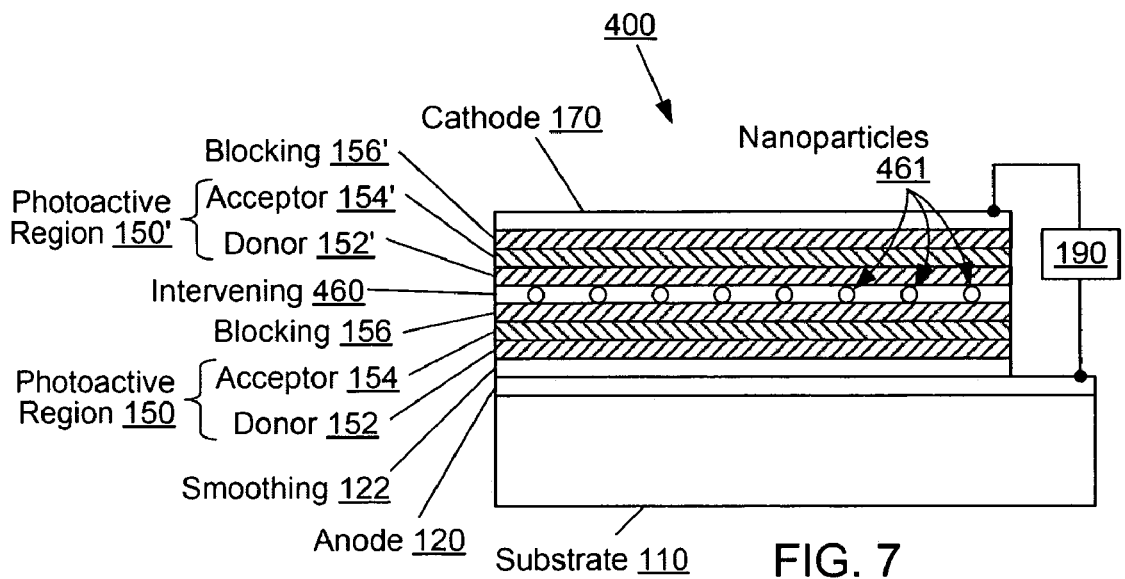
FIG. 7 illustrates tandem photosensitive cells in series.
Figure 8:
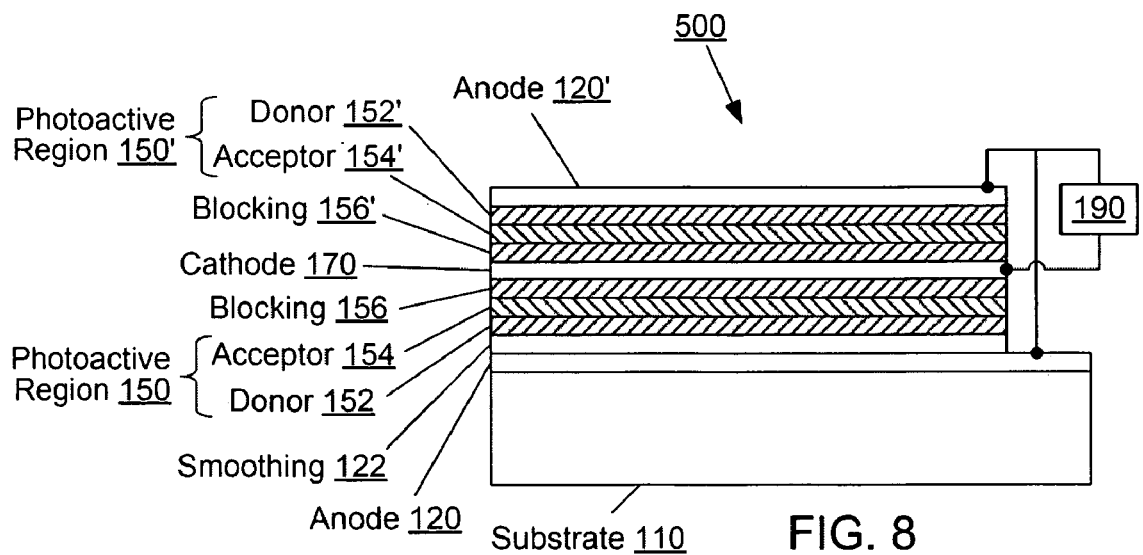
FIG. 8 illustrates tandem photosensitive cells in parallel.

FIGS. 7 and 8 illustrate examples of tandem devices including such transparent charge transfer layers, electrodes, and charge recombination zones. In device 400 in FIG. 7, photoactive regions 150 and 150' are stacked electrically in series with an intervening conductive region 460. As illustrated without external electrical connections, intervening conductive region 460 may be a charge recombination zone or may be a charge transfer layer. As a recombination zone, region 460 comprises recombination centers 461 with or without a transparent matrix layer. If there is no matrix layer, the arrangement of material forming the zone may not be continuous across the region 460. Device 500 in FIG. 8 illustrates photoactive regions 150 and 150' stacked electrically in parallel, with the top cell being in an inverted configuration (i.e., cathode-down). In each of FIGS. 7 and 8, the photoactive regions 150 and 150' and blocking layers 156 and 156' may be formed out of the same respective materials, or different materials, depending upon the application. Likewise, photoactive regions 150 and 150' may be a same type (i.e., planar, mixed, bulk, hybrid) of heterojunction, or may be of different types.

In each of the devices described above, layers may be omitted. Other layers may be added, such as reflective layers or additional photoactive regions. The order of layers may be altered or inverted. A concentrator or trapping configuration may be employed to increase efficiency, as disclosed, for example in U.S. Pat. No. 6,333,458 to Forrest et al. and U.S. Pat. No. 6,440,769 to Peumans et al., which are incorporated herein by reference. Coatings may be used to focus optical energy into desired regions of a device, as disclosed, for example in U.S. patent application Ser. No. 10/857,747 entitled "Aperiodic dielectric multilayer stack" by Peumans et al., filed Jun. 1, 2004, which is incorporated herein by reference. In the tandem devices, transparent insulative layers may be formed between cells, with the electrical connection between the cells being provided via electrodes. Also in the tandem devices, one or more of the photoactive regions may be a Schottky-barrier heterojunction instead of a donor-acceptor heterojunction. Arrangements other than those specifically described may be used.

As used herein, the term "subcell," refers to an organic photosensitive optoelectronic construction, which may include an exciton blocking layer in accordance with the present invention. When a subcell is used individually as a photosensitive optoelectronic device, it typically includes a complete set of electrodes, i.e., positive and negative. As disclosed herein, in some stacked configurations it is possible for adjacent subcells to utilize common, i.e., shared, electrode or charge transfer layers. In other cases, adjacent subcells do not share common electrodes or charge transfer layers. The term "subcell" is disclosed herein to encompass the subunit construction regardless of whether each subunit has its own distinct electrodes or shares electrodes or charge transfer layers with adjacent subunits. Herein the terms "cell," "subcell," "unit," "subunit," "section," and "subsection" are used interchangeably to refer to a photoconductive layer or set of layers and the adjoining electrodes or charge transfer layers. As used herein, the terms "stack," "stacked," "multisection" and "multicell" refer to any optoelectronic device with multiple layers of a photoconductive material separated by one or more electrode or charge transfer layers.

Since the stacked subcells of the solar cell may be fabricated using vacuum deposition techniques that allow external electrical connections to be made to the electrodes separating the subcells, each of the subcells in the device may be electrically connected either in parallel or in series, as discussed above, depending on whether the power and/or voltage generated by the solar cell is to be maximized. The improved external quantum efficiency that may be achieved for stacked solar cell embodiments of the present invention may also be attributed to the fact that the subcells of the stacked solar cell may be electrically connected in parallel, as a parallel electrical configuration permits substantially higher fill factors to be realized than when the subcells are connected in series.

Although the high series resistance of photoconductive organic materials inhibits use of subcells in a series configuration for high power applications, there are certain applications, for example, in operating liquid crystal displays (LCD), for which a higher voltage may be required, but only at low current and, thus, at low power levels. For this type of application, stacked, series-connected solar cells may be suitable for providing the required voltage to the LCD. In the case where the solar cell comprises subcells electrically connected in series to produce the desired higher voltage device, the stacked solar cell may be fabricated so each subcell produces approximately the same current to reduce inefficiency. For example, if the incident radiation passes through in only one direction, the stacked subcells may have an increasing thickness with the outermost subcell, which is most directly exposed to the incident radiation, being the thinnest. Alternatively, if the subcells are superposed on a reflective surface, the thicknesses of the individual subcells may be adjusted to account for the total combined radiation admitted to each subcell from the original and reflected directions.

Further, it may be desirable to have a direct current power supply capable of producing a number of different voltages. For this application, external connections to intervening electrodes could have great utility. Accordingly, in addition to being capable of providing the maximum voltage that is generated across the entire set of subcells, in an exemplary embodiment, the stacked solar cells of the present invention may also be used to provide multiple voltages from a single power source by tapping a selected voltage from a selected subset of subcells.

The present invention is directed to exciton blocking layers, EBLs, comprising phenanthroline derivatives, and to organic thin-film photosensitive optoelectronic devices comprising an EBL of the invention.

As used herein, the term "phenanthroline derivative" refers to a compound of formula

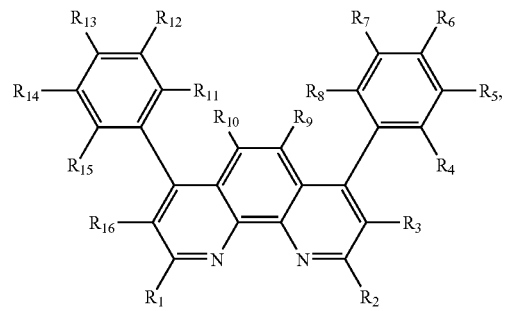

where $R_1$ to $R_{16}$ are hydrogen, alkyl, phenyl, or substituted phenyl, with the proviso that $R_1$ and $R_2$ are not both hydrogen and are not both methyl when $R_3$ to $R_{16}$ are all hydrogen. Also, as used herein, a "BCP derivative or analog" is a phenanthroline derivative in which $R_3$ to $R_{16}$ are all hydrogen, i.e., a compound of formula

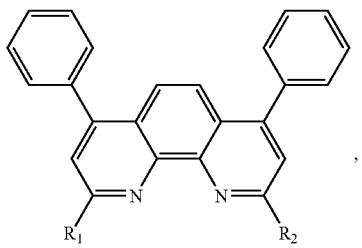

BCP is a compound of that formula in which $R_1$ and $R_2$ are both methyl, BPhen is a compound of that formula in which $R_1$ and $R_2$ are both H, and n-BBP is a compound of that formula in which $R_1$ is H, and $R_2$ is n-butyl.

As used herein, in each of the following BCP analogs, $R_1$ is a hydrogen, H, and $R_2$ has the indicated structure:

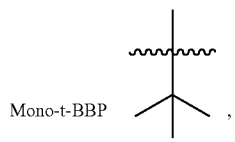

Mono-t-BBP

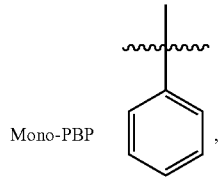

Mono-PBP

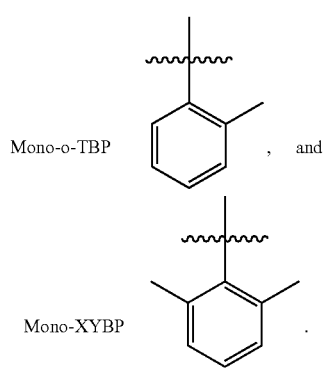

Mono-o-TBP , and

Mono-XYBP .

As used herein, in each of the following BCP analogs, $R_1$ and $R_2$ each has the indicated structure:

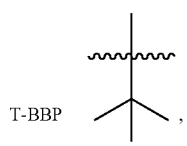

T-BBP ,

PBP ,

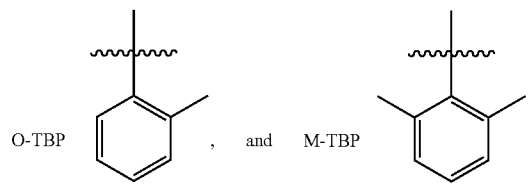

O-TBP , and M-TBP .

As used herein, P(o-T)BP is a BCP analog in which

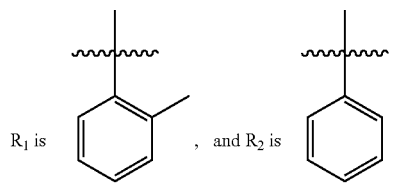

$R_1$ is , and $R_2$ is .

As used herein, the terms "asymmetric phenanthroline derivative" and "asymmetric BCP derivative" or "asymmetric BCP analog" refer to phenanthroline derivatives and BCP derivatives having asymmetric substituents. That is, corresponding substituents, e.g., $R_1$ and $R_2$, $R_3$ and $R_{16}$, $R_7$ and $R_{12}$, etc., differ. Therefore, mono-t-BBP, mono-PBP, mono-o-TBP, and mono-XYBP are asymmetric BCP derivatives or analogs. Substituents on phenanthroline derivatives and BCP derivatives, particularly asymmetric substituents, decrease the crystal-growth velocity of the EBLs, increasing the lifetime of the device. Although, in some cases, there may be a decrease in the $T_g$ as well.

Exemplary embodiments were fabricated on pre-cleaned glass substrates coated with a ~1500 Å thick transparent, conducting indium-tin-oxide (ITO) anode (with a sheet resistance of 40Ω/□). Prior to deposition, the organic materials were purified in three cycles using thermal gradient sublimation. Films were grown onto the ITO employing ultrahigh vacuum ($1\times10^{-1}$ Torr) organic molecular beam deposition in the following sequence: 30 Å to 600 Å thick films of donor-like copper-phthalocyanine (CuPc) was followed by a 30 Å to 600 Å thick films of acceptor-like material, such as 3,4,9,10-perylenetetracarboxylic bisimidazole (PTCBI) or $C_{60}$. Next, a 100 Å to 200 Å thick film of an EBL material of the invention or, for comparison, bathocuproine (BCP) was deposited. BCP with a 3.5 eV energy gap has previously been shown to be an effective exciton blocker that can easily transport electrons to the top 800 Å thick Ag cathode (evaporated at $1\times10^{-6}$ Torr, through a shadow mask with 1 mm diameter openings, in a separate vacuum chamber after exposing the organics to the atmosphere) from the adjoining PTCBI layer. PBP, which has a 3.2 eV energy gap, has also been found to be an effective exciton blocker that can easily transport electrons. The energy gaps of other EBL materials of the invention are not believed to differ significantly from that of BCP, as the substituents should affect the HOMO and LUMO levels equally, such that the gap will remain largely fixed. All electrical measurements of the completed organic photosensitive optoelectronic devices were performed in air unless otherwise specified.

Figure 9:
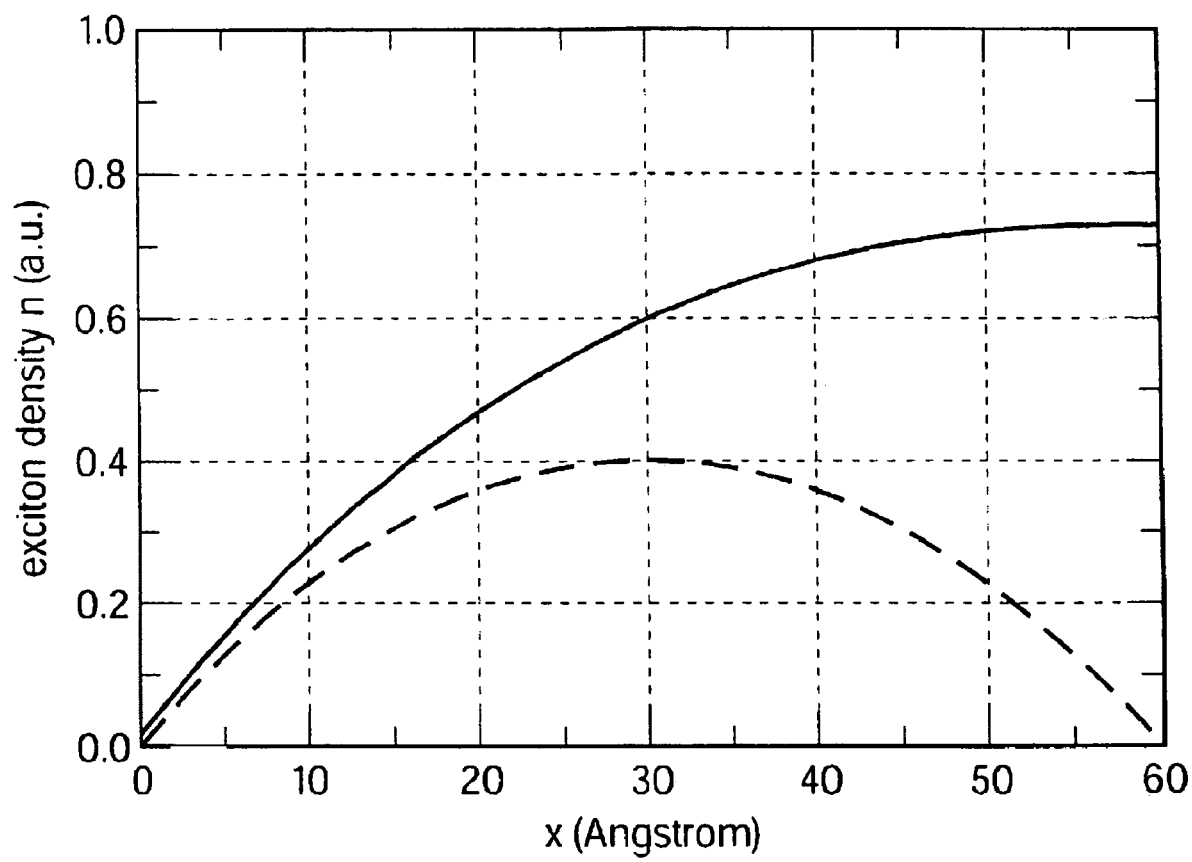
FIG. 9 is a graph of calculated exciton density profiles comparing the effect of an EBL with the effect of an exciton quenching interface.

FIG. 9 is a theoretical calculation of exciton density as a function of position in a photosensitive organic material under two different boundary conditions for the right interface. Both exciton profiles are for a 60 Å thick layer of an organic photosensitive material, e.g., PTCBI or $C_{60}$, assuming uniform generation of excitons throughout the film. The uniform generation follows from assuming $L_D \ll \alpha^{-1}$, i.e., the absorption length is much greater than the exciton diffusion length. Here, the exciton diffusion length, $L_D$, was taken to be 30 Å. The full line assumes an EBL to the right hand side. The dashed line has a quenching interface at the right hand side. In both cases, the left hand interface is the intentional exciton sink (for example a CuPc/PTCBI or $C_{60}$ interface). In a device in accordance with the present invention, excitons are purposefully lost at the exciton sink interface where they are converted to pairs of free charge carriers. The much higher value of the solid curve at the right end of the graph illustrates that the exciton recombination rate at the interface with the EBL is much lower, and is preferably negligible.

Figure 10:
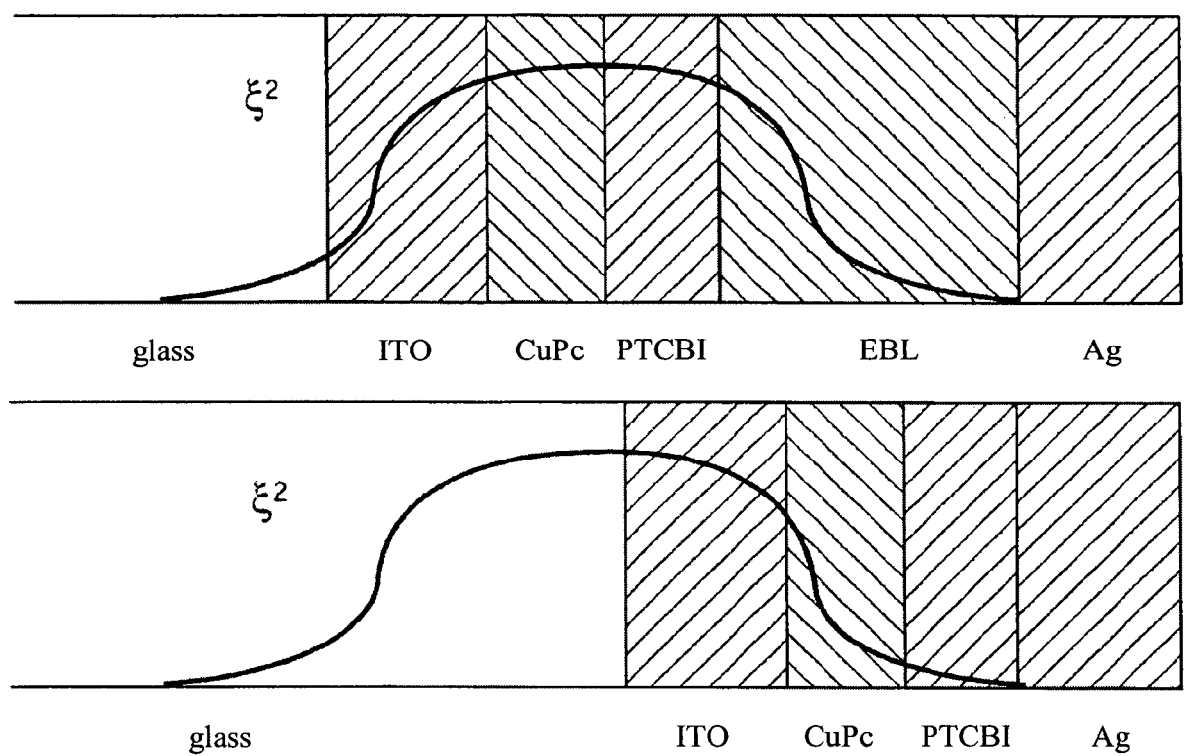
FIG. 10 depicts an effect of an EBL to shift the active region of exciton dissociation to the region of maximum optical electric field intensity.

FIG. 10 illustrates another beneficial attribute of an EBL in certain device configurations. The active region is predicted to shift away from the region of vanishing optical electric field when an exciton blocking layer is inserted in an organic photosensitive optoelectronic device having a metallic back electrode, e.g., Ag. As can be seen from this graph, the insertion of an exciton blocking layer of an exciton blocking material of the invention effectively increases the average value of the square of the electric component, $\xi^2$, of the optical field in the active regions of the device. The optical electric field profile depicted is conceptual, and arises because of boundary conditions at the metallic interface, which correspond to optical reflection. Note that the actual optical electric field profile will depend on the dielectric constant of the respective layers traversed by the incident light and varies for the different wavelengths of the incident radiation. While the details may vary, it is apparent that inserting an EBL layer in an exemplary device configuration, such as depicted in FIG. 10, provides some additional separation between the back reflecting electrode and the heterojunction. This is likely to put the heterojunction in a region of higher optical electric field. The shift of the optical electric field increases the absorption of the active layers, and, hence, the photon collection efficiency. This does not affect the internal quantum efficiency. However, in a device wherein the captured light is reflected multiple times through the photoactive layers, such as the waveguide configuration described later herein, it does affect the required number of passes the light must make to obtain high external efficiencies. In stacked devices, which generally lack reflective layers, this absorption enhancement effect will not be present, as the mean square value of the optical electric field will generally be a purely decaying function of the penetration depth into the device of the incident radiation.

Figure 11:
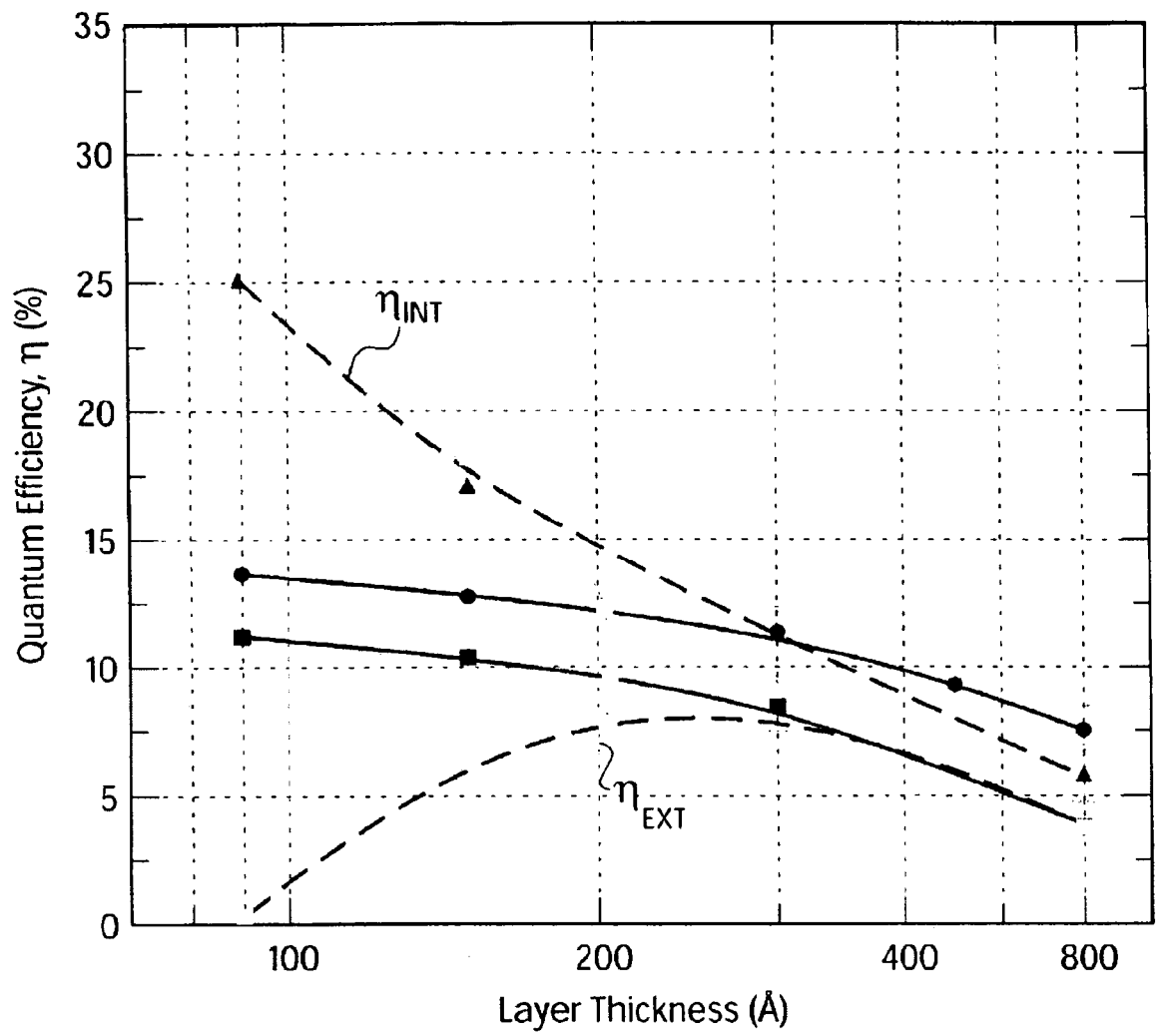
FIG. 11 is a graph of measured external quantum efficiency ($\eta_{EXT}$) at $\lambda$=620 nm of ITO/CuPc/PTCBI/BCP/Ag devices as a function of different layer thicknesses.

FIG. 11 shows the external quantum efficiency ($\eta_{EXT}$) at $\lambda=620$ nm (corresponding to an absorption peak of CuPc) of several exemplary devices, comprising BCP EBLs, e.g., ITO/CuPc/PTCBI/BCP/Ag, as a function of different layer thicknesses. For devices with 300 Å PTCBI and 100 Å BCP (filled circles), an increase in $\eta_{EXT}$ is observed as CuPc layer thicknesses is reduced. Similarly, for devices with 300 Å CuPc and 100 Å BCP (filled squares), an increase in $\eta_{EXT}$ is observed at $\lambda=540$ nm (an absorption peak of PTCBI) as the PTCBI layer thicknesses is reduced. If the EBL is omitted, the PV cell photocurrent response is significantly reduced for the thinnest cells. Note that the EBL layer allows for the fabrication of devices with total active layer thicknesses of only 60 Å without electrical shorts. In addition, electrical measurements show that the series resistance of the cells remains unaffected for BCP layers as thick as 200 Å BCP. Similar results are obtained using EBL layers comprising phenanthroline derivatives of the invention.

The monotonic increase of $\eta_{EXT}$, and the even greater increase of $\eta_{INT}$ with decreasing photoactive layer thicknesses in the presence of the EBL provide striking evidence that excitons must diffuse to the heterointerface for efficient dissociation and subsequent charge collection. The decreasing external quantum efficiency for thicker films is then solely due to the increased absorption in inactive regions (i.e. regions further than one diffusion length from the heterointerface). It is thought that in addition to keeping photogenerated excitons away from the quenching Ag interface, the EBL also helps prevent the incurrence of Ag clusters into the electron transport layer. Such clusters can cause shorting defects and provide additional quenching sites for excitons.

Figure 12A:
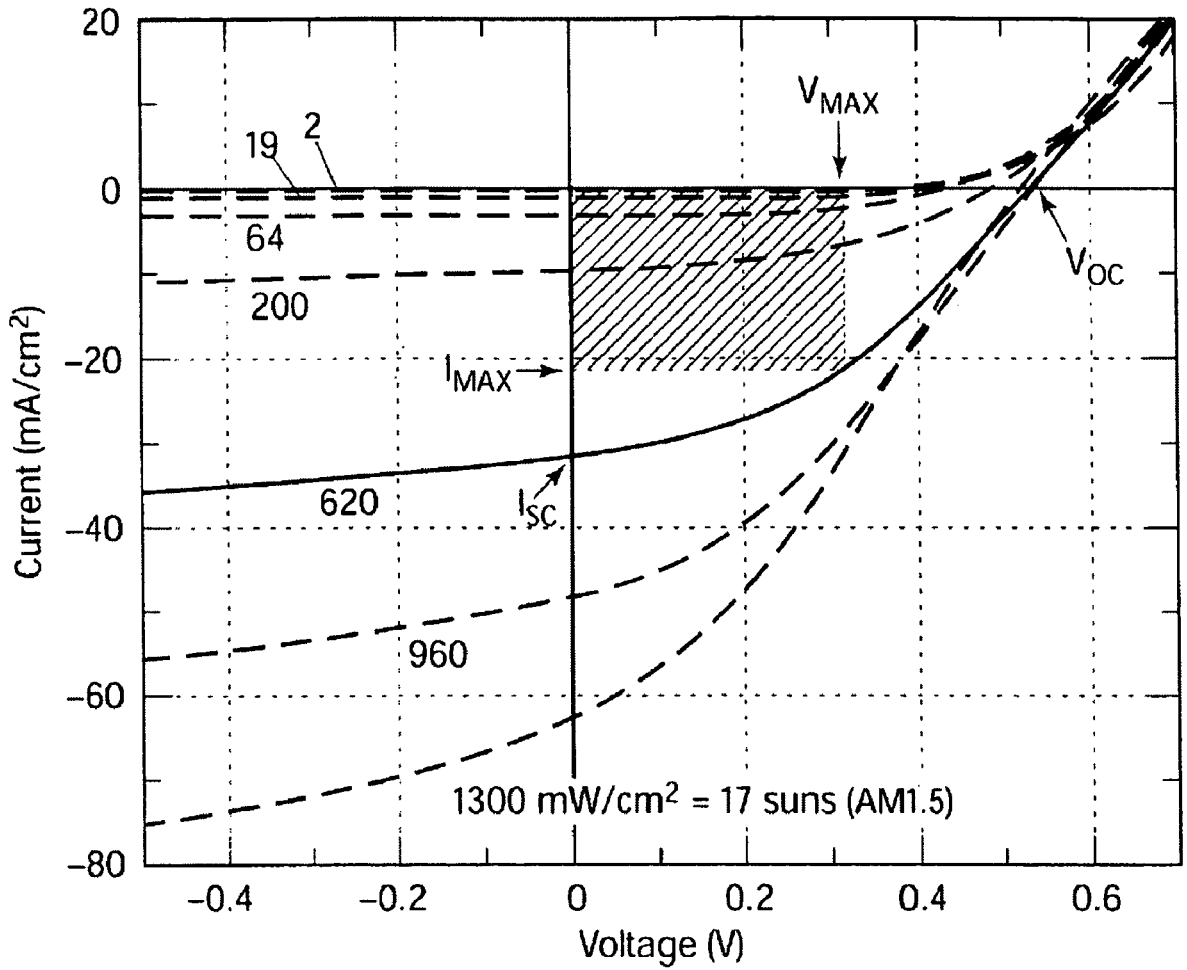
FIG. 12A is a graph of current vs. voltage (I-V) measurements of a thin device incorporating an EBL (ITO/150 Å CuPc/160 Å PTCBI/150 Å BCP/:PTCBI/800 Å Ag) under different intensities of AM1.5 spectral illumination.

The current vs. voltage, I-V, measurements of another device, comprising a BCP ETL, i.e., ITO/150ACuPc/60 Å PTCBI/150 Å BCP:PTCBI/800 Å Ag, under different intensities of AM1.5 spectral illumination are illustrated in FIG. 12A. Simulated spectral illumination of variable intensity was obtained under a nitrogen atmosphere using a 150 W Xe arc lamp equipped with AM1.5 and neutral density filters to attenuate the beam. (The optical power was measured using a calibrated Si photodiode from Newport, Inc. The Xe arc lamp was from Oriel.) The I-V response is characterized by a shunt resistance ($R_oA$, where A is the junction area) of 20±2 k$\Omega$-cm$^2$, and a small series resistance of 30±10 $\Omega$-cm$^2$. The dark current follows the expression for a classical p-n junction diode with an ideality factor of n=1.4-1.7. These values compare favorably with amorphous silicon cells and are a significant improvement over previous reports of polymer thin film cells.

Figure 12B:
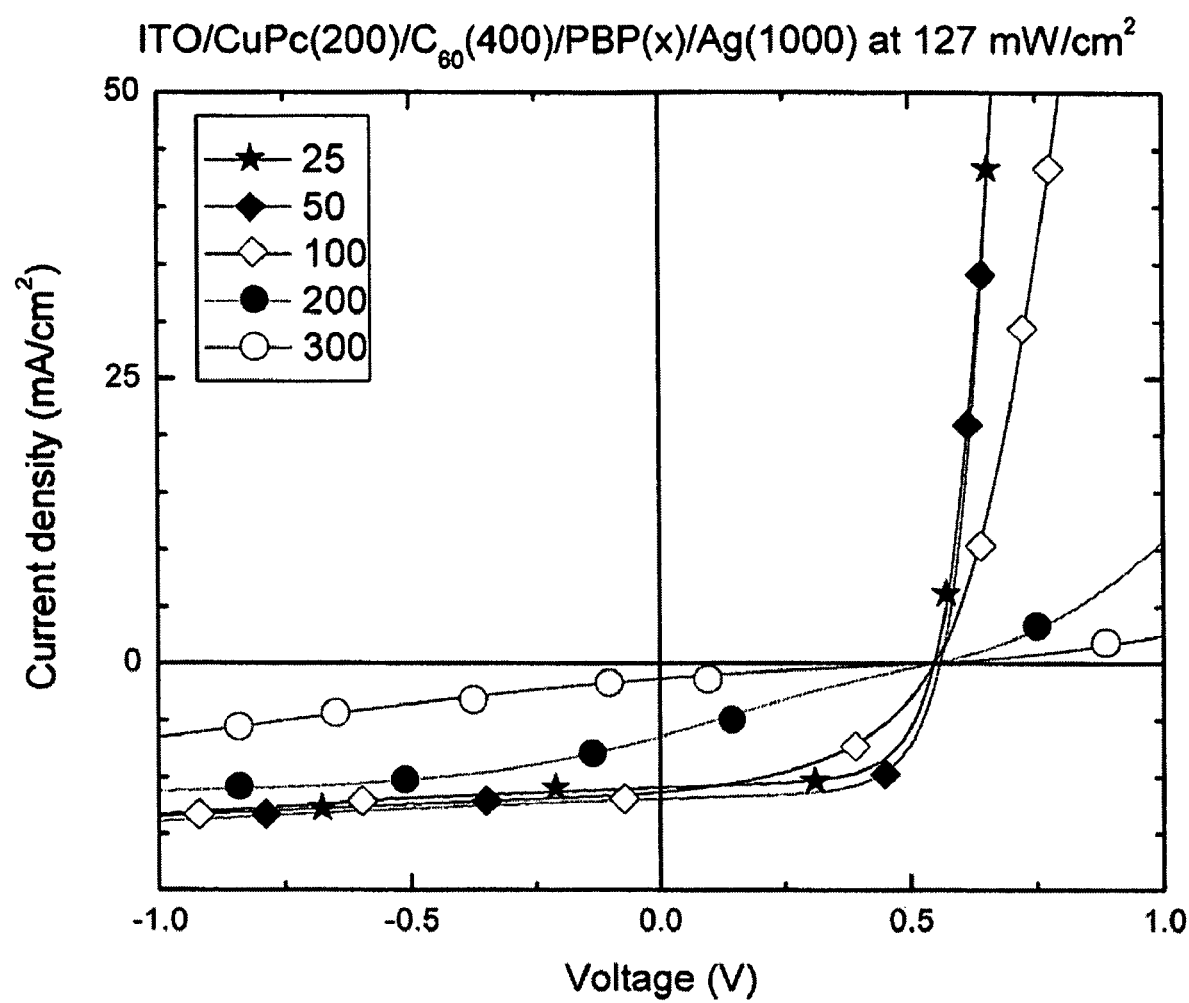
FIG. 12B illustrates the changes in short circuit current and open-circuit voltage with varying thickness of a PBP EBL layer.

Similar current vs. voltage, I-V, measurements for devices in accordance with the present invention, comprising PBP EBLs, i.e., ITO/CuPc(200 Å)/$C_{60}$(400 Å)/PBP(xÅ)/Ag (1000 Å) at 127 mW/cm$^2$, are illustrated in FIG. 12B. The data demonstrate that increasing the thickness of the PBP EBL results in a significant decrease in the short circuit current, $I_{sc}$, but with little change in the open circuit voltage, $V_{oc}$.

It should be appreciated that the BCP layer in the device of FIG. 12A was doped with ~10% (by weight) of PTCBI. It is thought that the BCP, as deposited in the described devices, is amorphous. It is believed that good quality crystalline BCP would also function as an EBL, and might have better electron transport properties. However, it may be difficult or inefficient to prepare good crystalline material. As discussed above, amorphous BCP exciton blocking layers do exhibit film recrystallization, which is especially rapid under high light intensities. The resulting morphology change to polycrystalline material results in a lower quality film with possible defects, such as shorts, voids or intrusion of electrode material. U.S. Pat. No. 6,451,415 discloses that it has been found that doping of some EBL materials, such as BCP that exhibit this effect, with a suitable, relatively large and stable molecule can stabilize the EBL structure to prevent performance degrading morphology changes. It should be further appreciated that doping of an EBL, which is transporting electrons in a given device, with a material having a LUMO energy level close to that of the EBL will help insure that electron traps are not formed, which might produce space charge build-up and reduce performance. Additionally, it should be appreciated that relatively low doping densities should minimize exciton generation at isolated dopant sites. As such excitons are effectively prohibited from diffusing by the surrounding EBL material, such absorptions reduce device photoconversion efficiency.

Figure 13A:
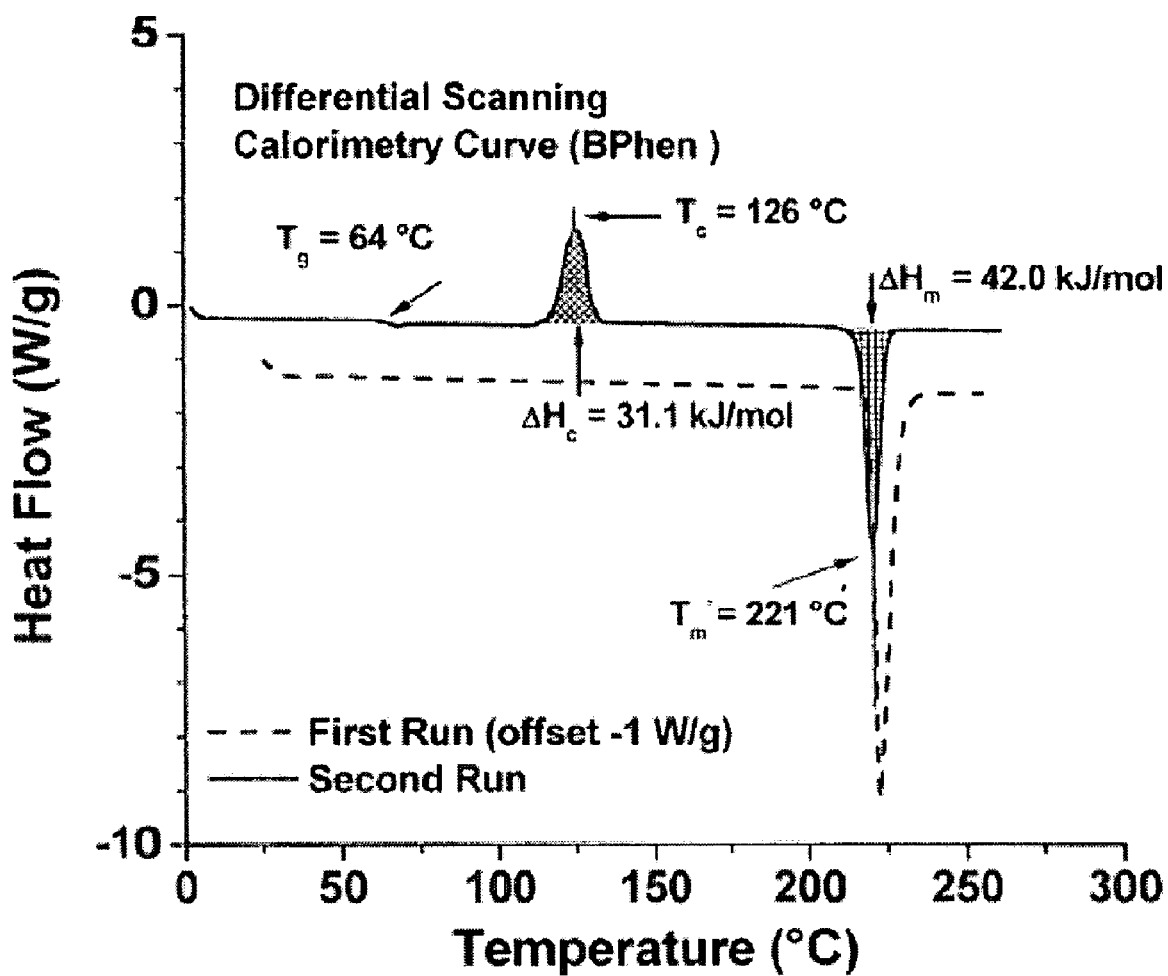
FIG. 13A illustrates the thermal characteristics of an EBL material useful in the invention, as measured using differential scanning calorimetry.
Figure 13B:
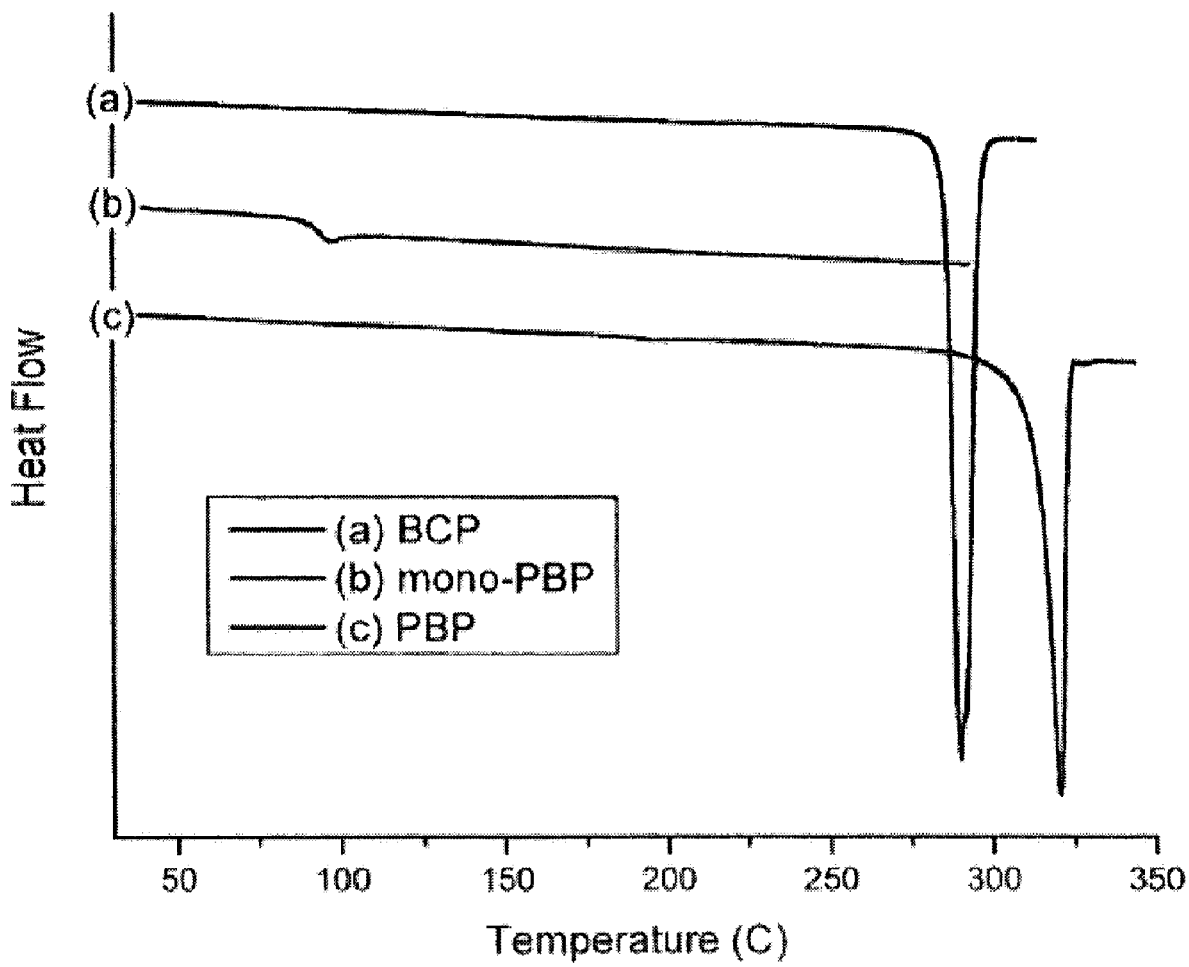
FIG. 13B illustrates a comparison of the thermal characteristics of BCP with those of an EBL material useful in the invention.

However, it has also been found that the phenanthroline derivatives, and in particular, the BCP analogs of the invention have high thermal stabilities, and significantly lower crystal-growth velocities than does BCP. As a result, doping is not required with the EBL materials of the invention, and the lifetimes of devices in accordance with the invention are significantly longer than devices comprising BCP ETLs. Thermal properties of EBL materials of the invention are provided in Table 1, and illustrated in FIGS. 13A and 13B. FIG. 13A illustrates first and second differential scanning calorimetry (DSC) scans for BPhen, where the first scan is of the crystalline material, and the second scan is of the amorphous material, which is formed by rapidly cooling and freezing the sample following the melted sample. In the first scan, no glass transition temperature, $T_g$, or crystalline transition temperature. $T_c$, is observed, but are observed inn the second scan. As illustrated in FIG. 13B, PBP has a higher melting point than BCP, and mono-PBP has a smaller crystal growth velocity.

TABLE 1

| Compound | $T_g$ (° C.) | $T_c$ (° C.) | $T_m$ (° C.) | $\Delta H_c$ (kJ/mol) | $\Delta H_m$ (kJ/mol) |
| --- | --- | --- | --- | --- | --- |
| BPhen | 64 | 126 | 221 | 31.1 | 42.0 |
| BCP | — | — | 290 | — | 48.2 |
| n-BBP | 13 | 89 | 141 | 26.8 | 31.6 |
| t-BBP | 60 | — | 200 | — | 20.0$^a$ |
| mono-t-BBP | 69 | — | — | — | — |
| mono-PBP | 90 | — | 238 | — | 36.7$^a$ |
| mono-o-TBP | 74 | — | — | — | — |
| mono-XYBP | 100 | — | — | — | — |
| PBP | — | — | 321 | — | 48.4 |
| o-TBP | 81 | — | 220 | — | 32.3$^a$ |
| m-TBP | 87 | 159 | 242 | 31.6 | 37.4 |
| P(o-T)BP | 94 | 196 | 225 | 19.4 | 21.4 |

$\Delta H_m$ values are the enthalpies of melting transitions in the second scan, unless denoted "a."

Figure 14A:
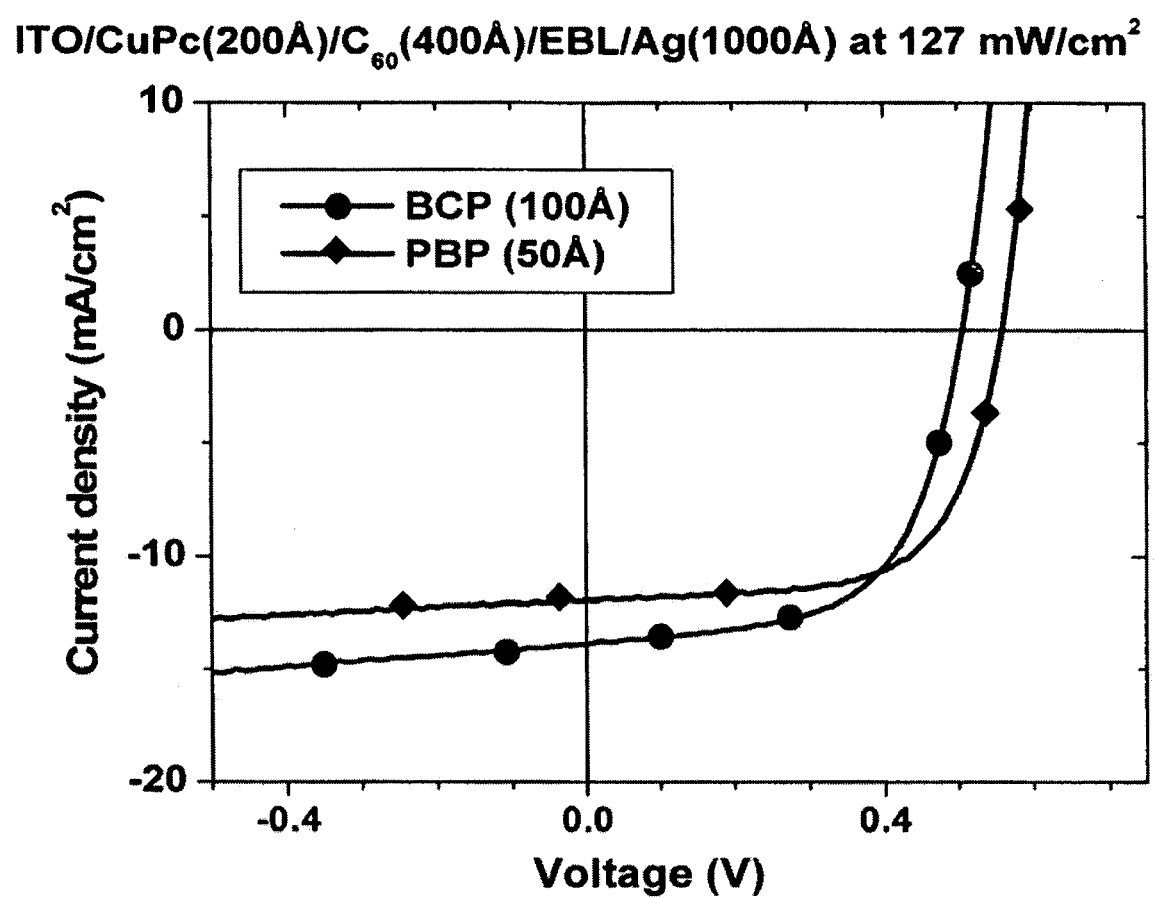
FIG. 14A illustrates plots of the current density v. the voltage of devices comprising EBLs of BCP and an EBL material useful in the invention.
Figure 14B:
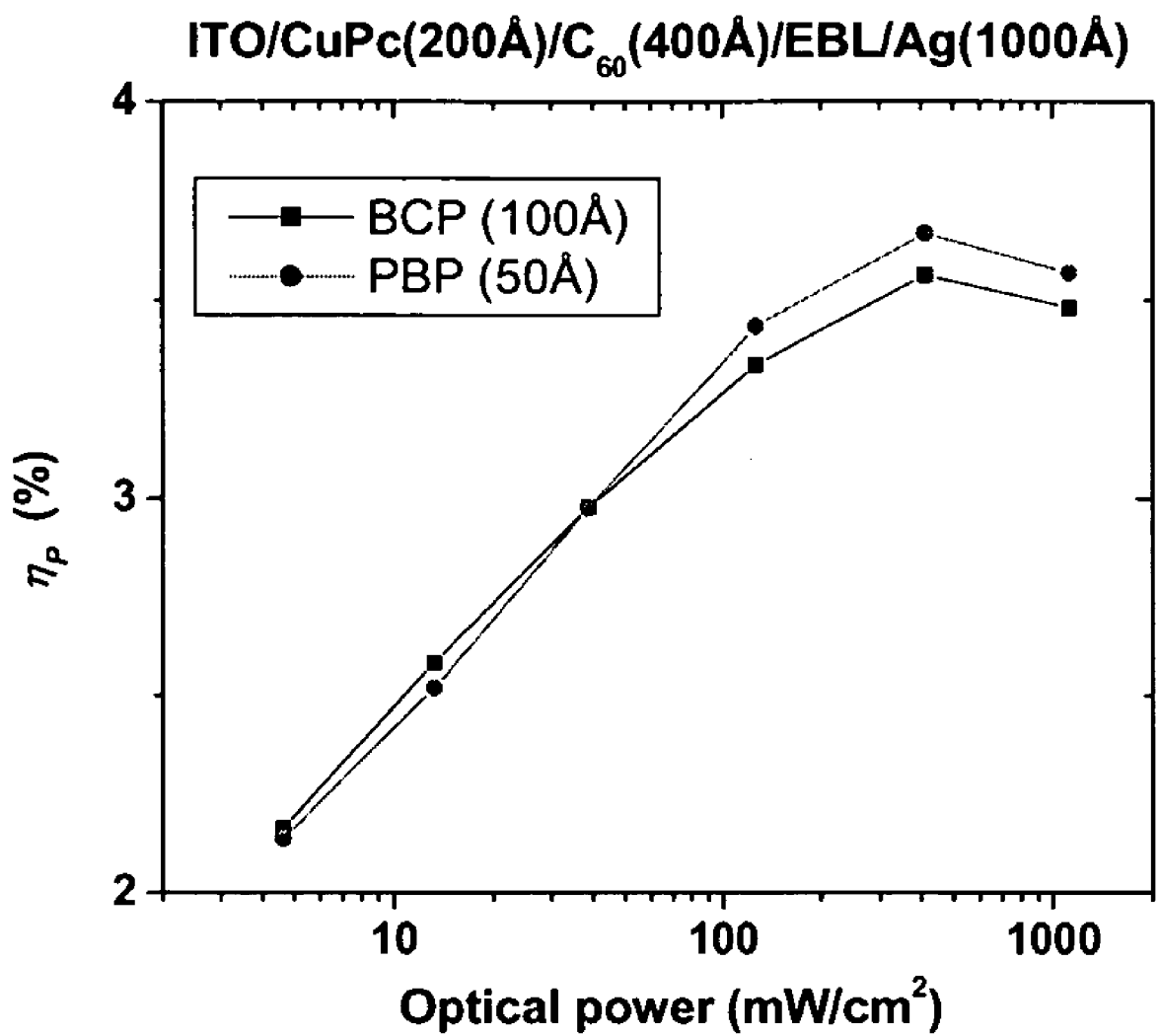
FIG. 14B illustrates a comparison of the power efficiency of the devices of FIG. 9A.
Figure 15A:
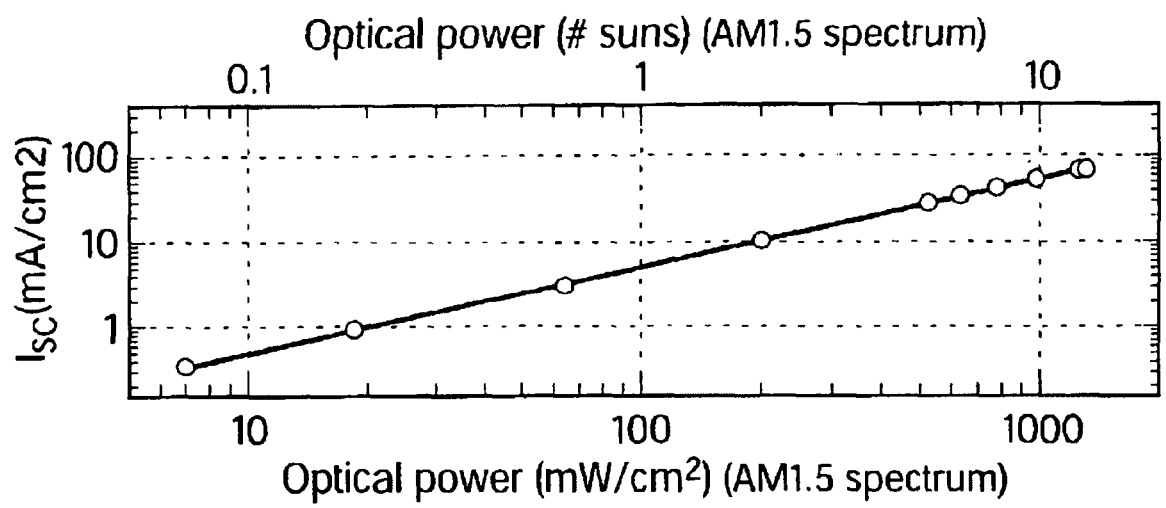
FIG. 15A to 15D illustrate characteristics of a stacked organic photosensitive optoelectronic device comprising a BCP EBL.
Figure 15B:
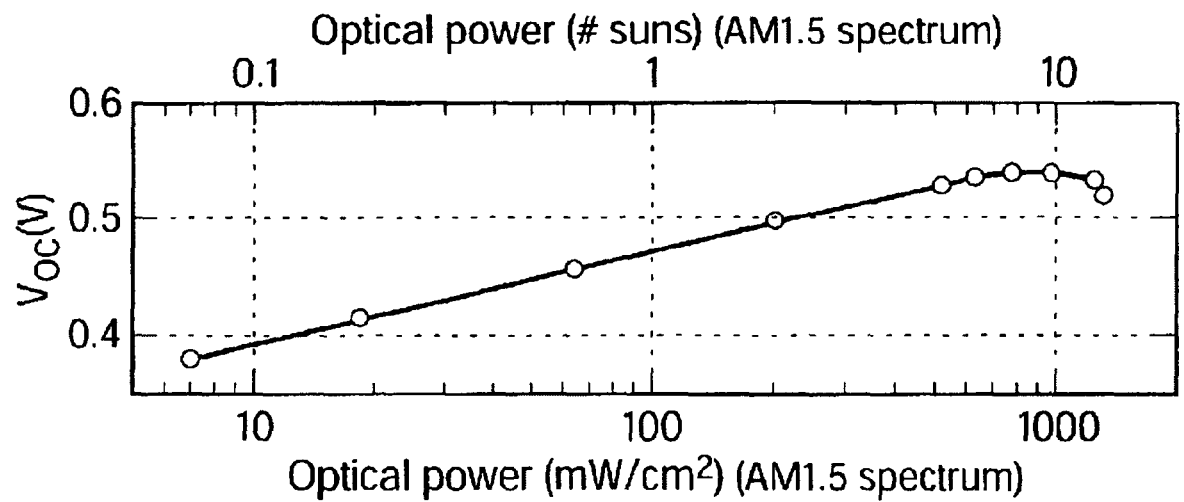
Figure 15C:
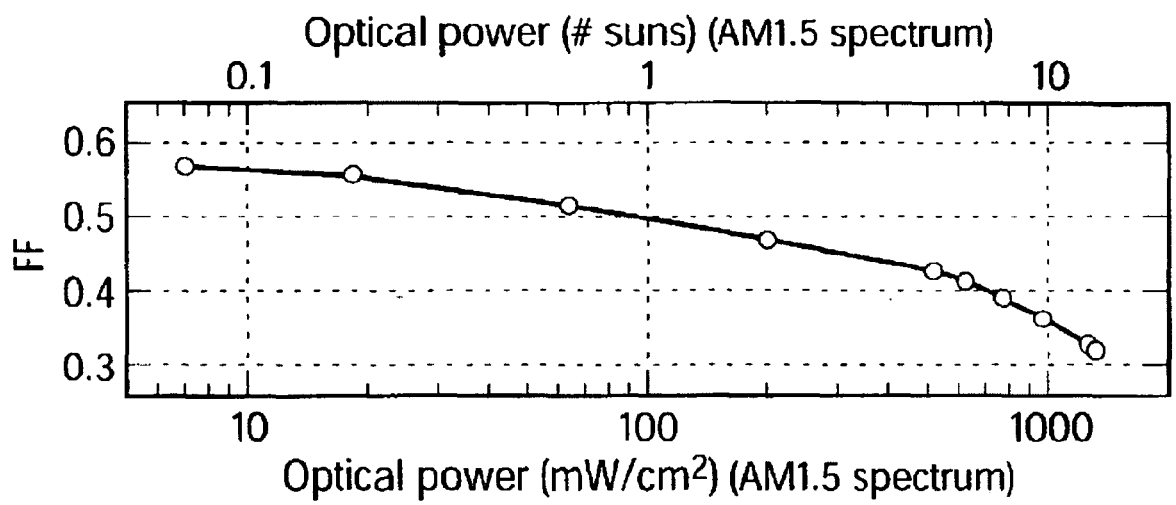
Figure 15D:
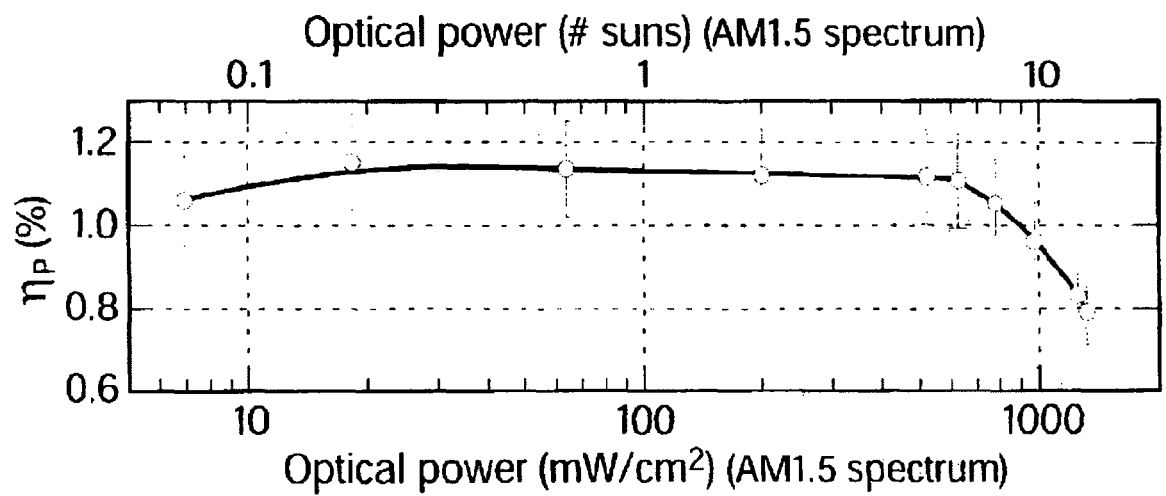

The I-V curve for a device in accordance with the invention, comprising a PBP EBL, is compared with a BCP device in FIG. 14A, and the power efficiency $\eta_p$ of the two devices is compared in FIG. 14B, demonstrating the effectiveness of the EBL materials of the invention. In addition, the phenanthroline derivative EBL materials of the invention have small to negligible red-shifts, compared to BCP, and reduced reduction potentials, such that the phenanthroline derivative EBL materials of the invention are not significant light absorbers, and, thus, the number of excitons formed in the EBL is not significant. Also, reducing the reduced reduction potentials of the EBL moves the LUMO energy of the EBL closer to that of an ETL, such as $C_{60}$, decreasing any barrier to electron migration from the ETL to the EBL. These comparisons demonstrate that the EBL materials of the present invention, which have improved thermal properties compared to BCP, and, thus, longer lifetimes, perform at least as well as BCP in organic photosensitive optoelectronic devices.

The dependence of the performance parameters for an organic photosensitive optoelectronic device, comprising a BCP EBL of the type disclosed in U.S. Pat. No. 6,451,415, on the AM1.5 optical flux is shown in FIG. 15A to 15D. The short-circuit current ($I_{sc}$) is linear with illumination intensity, indicating that even at the highest illumination levels of ~15 suns, no significant space charge build-up occurs. The open circuit voltage ($V_{oc}$) increases monotonically until it reaches a plateau of $V_{oc}$=0.54 V for illumination intensities>10 suns. The fill factor, ff:

$$ff = \frac{I_{max}V_{max}}{I_{sc}V_{oc}},$$

as defined in U.S. Pat. No. 6,451,415, and illustrated in FIG. 12A, approaches 0.57 at low intensities, a value typical for conventional inorganic solar cells, and exceeds the typical value of ff<0.35 found in other organic PVs even at the highest illumination intensities considered. As ff decreases with increasing $V_{oc}$ and light intensity, the external power conversion efficiency ($\eta_p$) at AM1.5 is only a slowly varying function of the illumination intensity, reaching a maximum of $\eta_p$=(1.1.+−.0.1)% over a broad plateau extending from 0.1 to 10 suns. These results and those of the devices disclosed in U.S. Pat. No. 6,451,415 represent a significant improvement over previous demonstrations of thin film organic PV cells, and provide efficient operation under simulated solar illumination of multiple suns without a decrease in power conversion efficiency.

Figure 16:
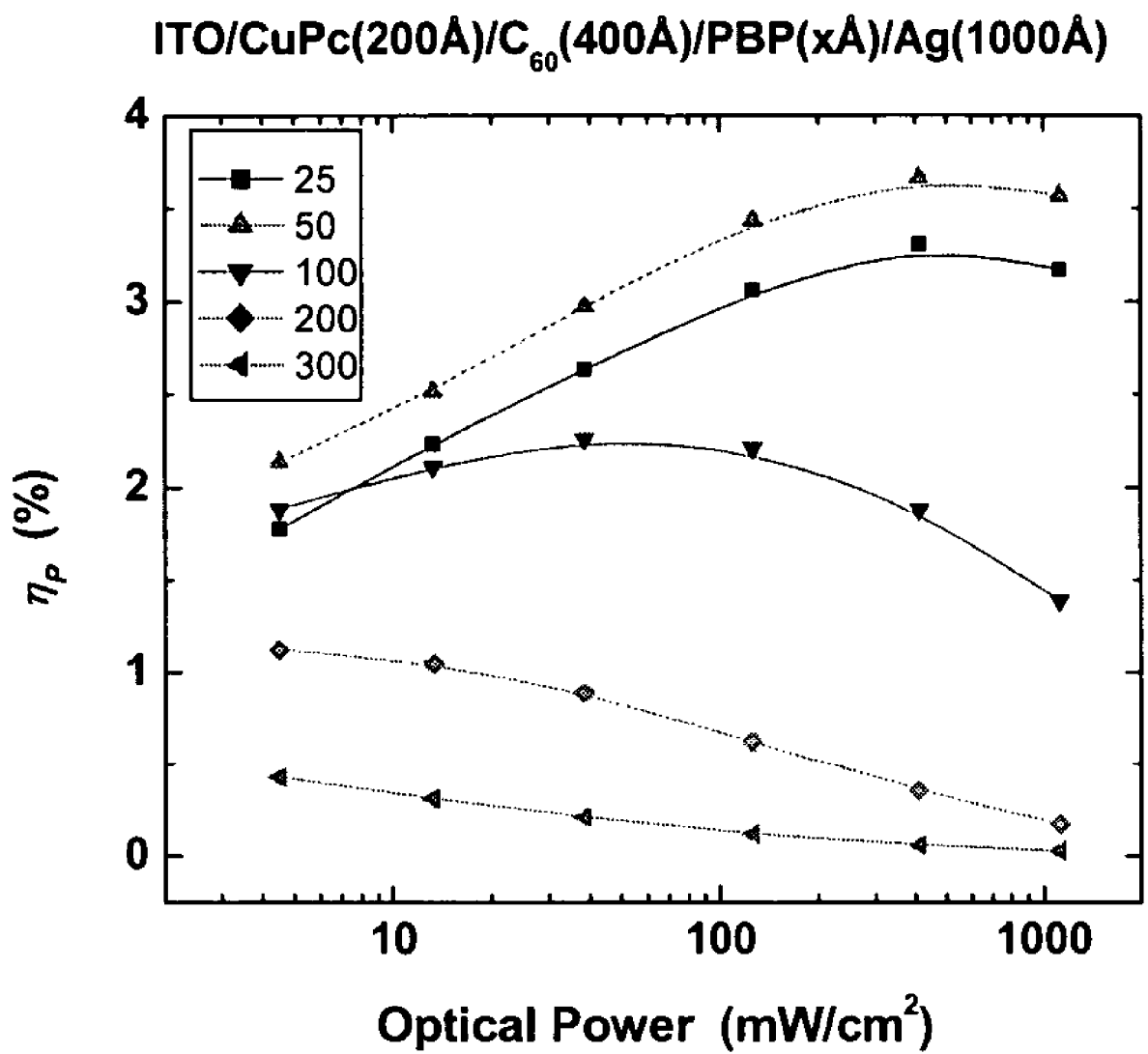
FIG. 16 illustrates the power conversion efficiency of a device comprising a PBP EBL, as a function of optical power and EBL thickness.
Figure 17:
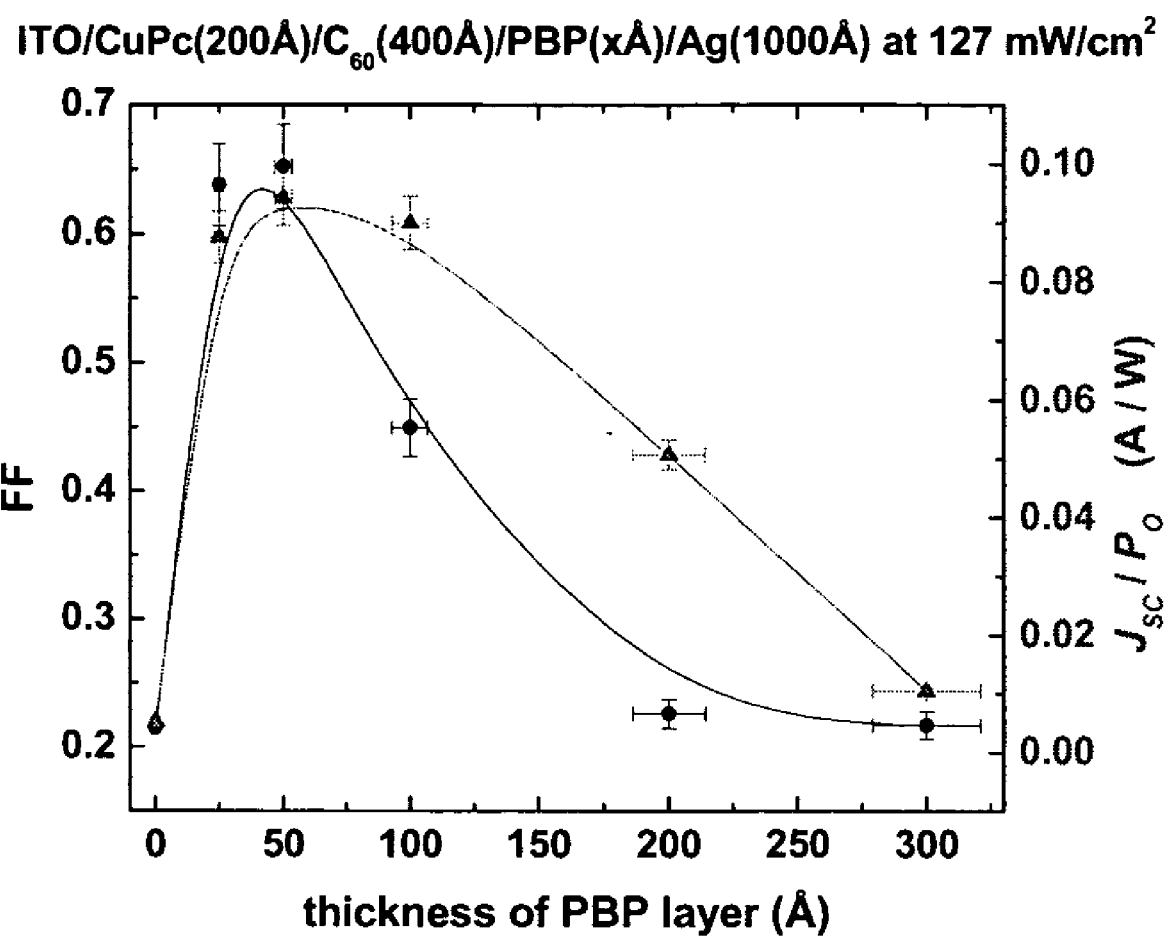
FIG. 17 illustrates the effect of an increase in EBL thickness on power conversion efficiency.

Similar data for devices of the invention, as illustrated in FIG. 16, demonstrate that, for a device comprising a PBP EBL, high power conversion efficiency can be obtained, but may decrease with increasing layer thickness. FIG. 17 illustrates that an increase in the PBP layer thickness will decrease the field effect (FF) and short-circuit current of device, resulting in a drop of power conversion efficiency at higher optical powers; a result similar to BCP based devices.

Overall, however, the PBP device data indicates that the use of the phenanthroline derivatives as EBLs in accordance with the invention, provides organic photosensitive optoelectronic devices that work as well as devices comprising BCP EBL materials. The improved thermal stability of the EBL materials of the invention, having lower crystallization velocities, particularly that of the asymmetric derivatives, improves the thermal stability of organic photosensitive optoelectronic devices, and extend the operational lifetime of such devices.

Figure 18:
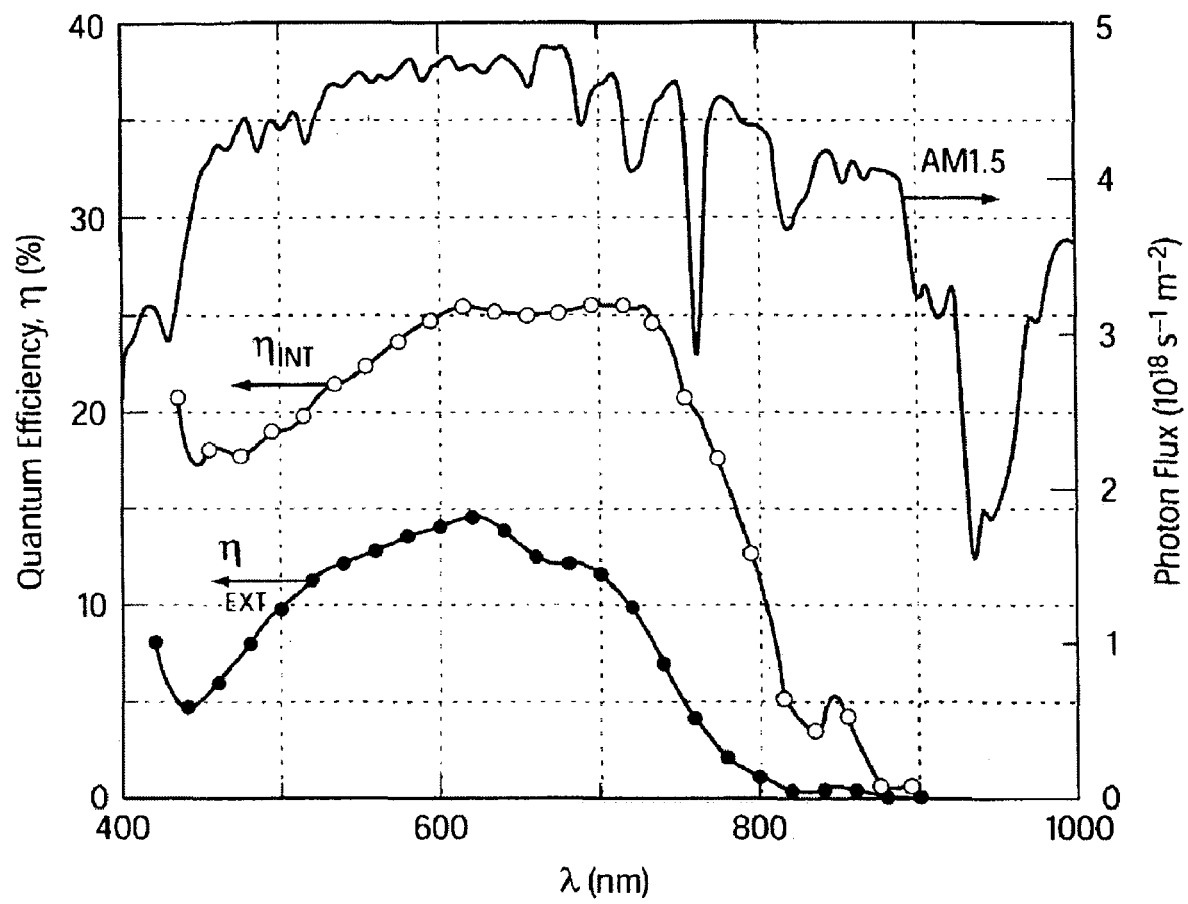
FIG. 18 illustrates characteristics of an exemplary waveguide geometry type organic photosensitive optoelectronic device.

FIG. 18 shows the photocurrent action spectrum ($\eta_{EXT}$, solid circles) at zero bias (short circuit condition) of a device in accord U.S. Pat. No. 6,451,415. The device structure was ITO/90 Å CuPc/90 Å PTCBI/100 Å BCP//Ag (a non-doped EBL). The excellent match of the action spectrum to the solar spectrum is apparent. The action spectrum also is well described by the sum of the absorption spectra of the organic films (weighted by the optical flux incident on each absorbing layer via the glass substrate), corroborating the assumption that the excitonic species is the intermediate state between photon absorption and the separated electron-hole pair. Now, $\eta_{EXT}$ is observed to increase linearly with reverse bias, with the slope of the photocurrent versus applied voltage dependent only on the PTCBI layer thickness. Further, the increase in $\eta_{EXT}$ follows the PTCBI absorption spectrum. Accordingly, the dependence of photocurrent on voltage is thought to be due to intrinsic photoconduction in PTCBI, i.e., exciton dissociation in the film bulk.

FIG. 18 also plots the spectral dependence of the calculated internal quantum efficiency ($\eta_{INT}$, open circles), with a maximum efficiency of 25% observed for PTCBI and CuPc thicknesses of 90 Å. It should be appreciated that an internal quantum efficiency of ~25% is consistent with analytical solutions to the exciton diffusion equation for the geometry of interest. This is a strong indication that the photon harvesting efficiency is limited only by exciton diffusion.

It is apparent from measurements of $\eta_{INT}$ that an increased $\eta_p$ can be achieved in a concentrator configuration where photons are forced to make multiple passes through the thin absorbing region. It should be appreciated that light incident on a transparent face of a device can generally be reflected off of an opposite interior reflecting layer once, and then either absorbed or, possibly, transmitted back out of the device. Device configurations are described in U.S. Pat. No. 6,333,458, (incorporated herein by reference), which cause any light admitted to a device to be reflected multiple times to increase absorption efficiency.

Figure 19:
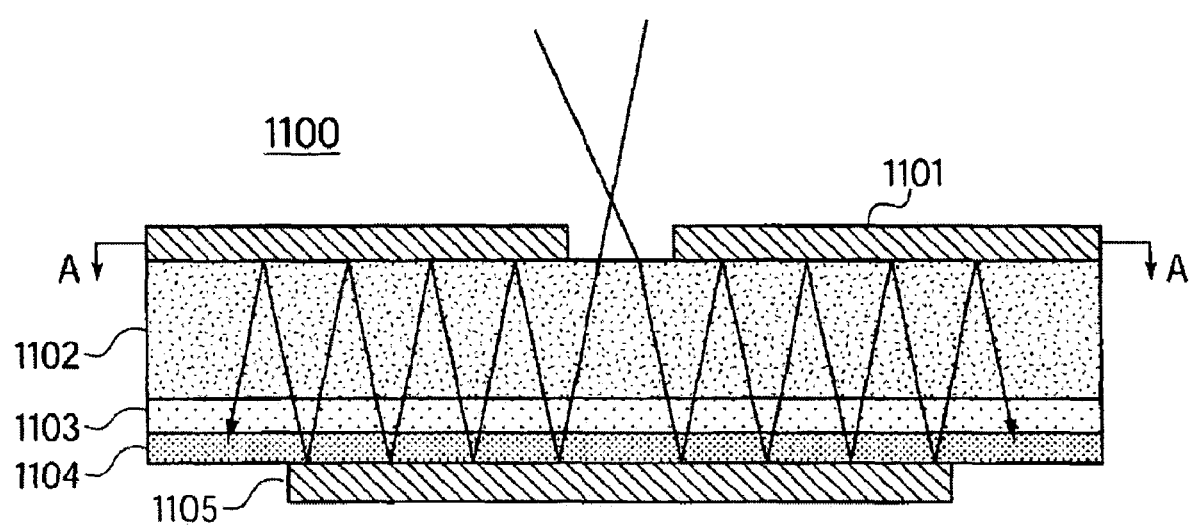
FIG. 19 depicts a waveguide type organic photosensitive optoelectronic device having an exciton blocking layer.

A device having a reflective Ag layer 1101 with a small aperture on the substrate surface, used to demonstrate this increase in efficiency, is illustrated in FIG. 19. A transparent layer 1102 of, for example, glass or plastic, is much wider than the optical coherence length. A transparent anode of degenerately doped ITO 1103 permits the light to reach electronically active layers 1104, and a metallic cathode 1105 reflects unabsorbed light. Concentrated radiation focused on an aperture in reflective layer 1101, and formed a near normal incidence beam reflects several times between the cathode and a Ag reflecting surface 1101, with each pass suffering additional absorption by a bilayer adjacent to an EBL (shown collectively as 1104, similar to FIG. 2).

Figure 20:
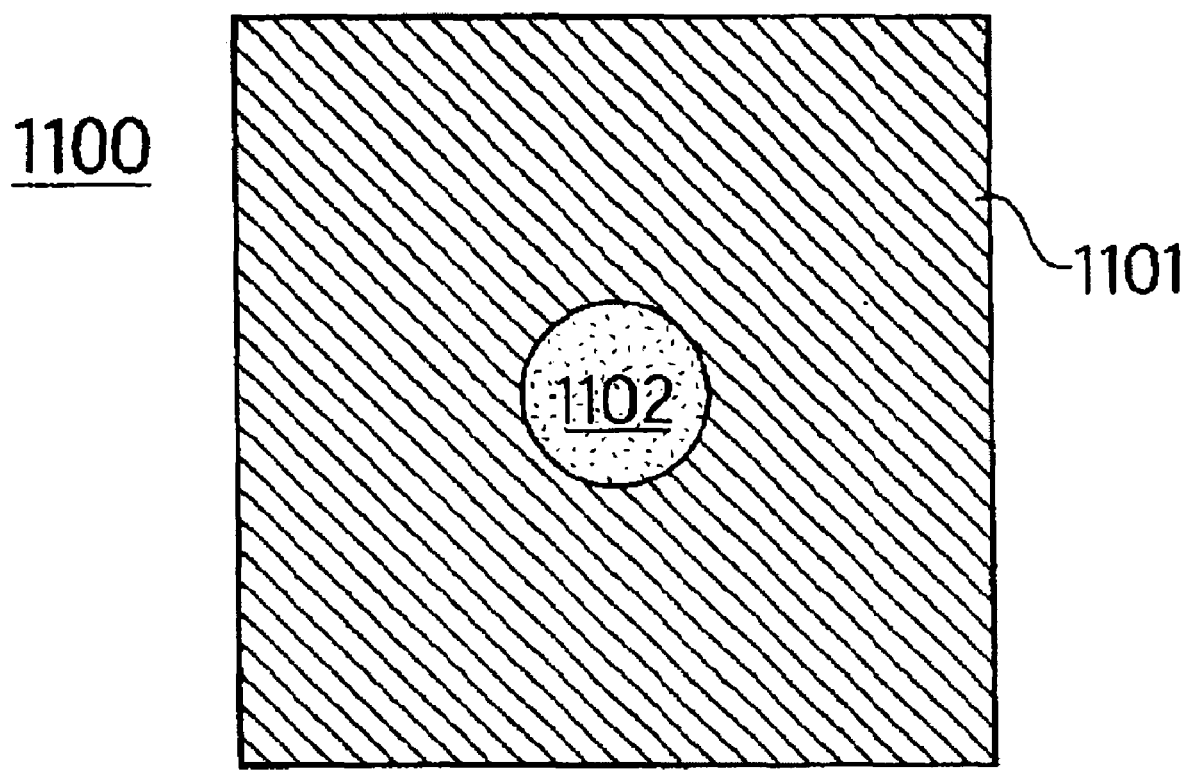
FIG. 20 is a top down view of FIG. 19 through line A-A.

FIG. 20 uses the same reference numerals as FIG. 19 to illustrate the circular aperture in reflective layer 1101, as layer 1102 can be seen through the aperture in this view of embodiment 1100 taken along line A-A in FIG. 19. Using this technique, an external power efficiency of $\eta_p=2.4\pm0.3\%$ was measured for a cell with 60 Å CuPc, 60 Å PTCBI and 150 Å BCP. This is believed to be the highest external power conversion efficiency at AM1.5 reported for an organic thin film photovoltaic cell. Similar efficiencies are believed possible with the devices comprising the phenanthroline derivative EBL materials of the invention with improved operational lifetimes. Note also that due to the small top electrode, not all of the incident radiation was trapped in this example. Hence, the power efficiency obtained represents a lower limit. By placing multiple, parallel connected cells, in a reflecting beam path, it is believed that, given a sufficient number of passes, efficiencies exceeding 3% can be achieved under improved light trapping. It should be appreciated that this device structure is particularly able to take advantage of the optical electric field enhancement depicted in FIG. 10.

It should also be appreciated that better control of the growth process would allow one to grow thinner, and, thus, more efficient devices. Further optimization of the transparency and reflectivity of the electrodes will reduce parasitic absorption. In addition, tuning the energy level alignment of the electron-donor and acceptor materials such that the binding energy of the exciton (~1 eV) more closely matches the open-circuit voltage will further enhance device performance. It is believed that ~80% internal efficiencies, corresponding to ~8% power conversion efficiencies are within the reach of such optimized organic solar cells.

It should be appreciated that the advantages of an organic photosensitive optoelectronic device having an EBL in a waveguide type device were demonstrated using simulated concentrated sun light. Nonetheless, actual sun light can be concentrated and directed into the photoactive regions of an organic photosensitive optoelectronic device, as described in U.S. Pat. No. 6,333,458.

Figure 21:
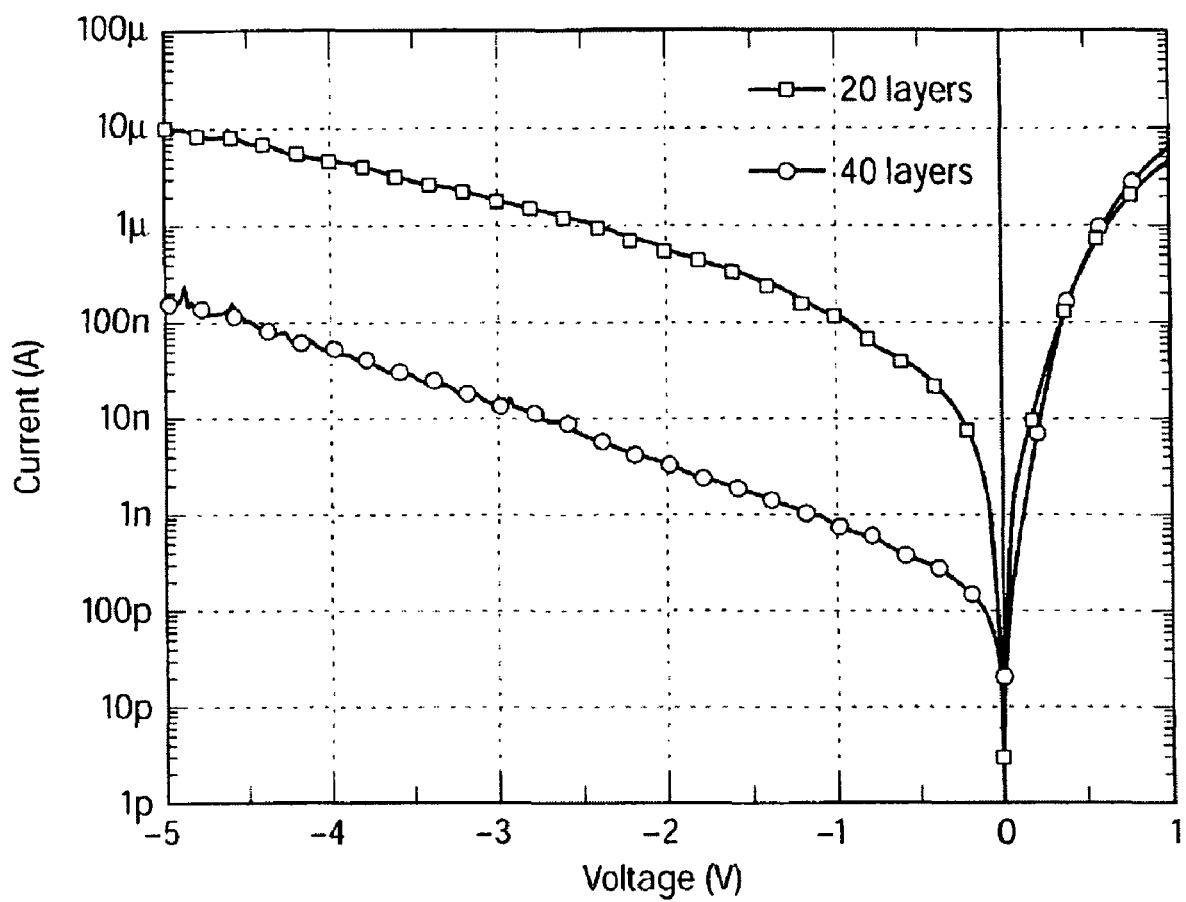
FIG. 21 is a graph of current/voltage characteristics of multilayer photodetectors.
Figure 22:
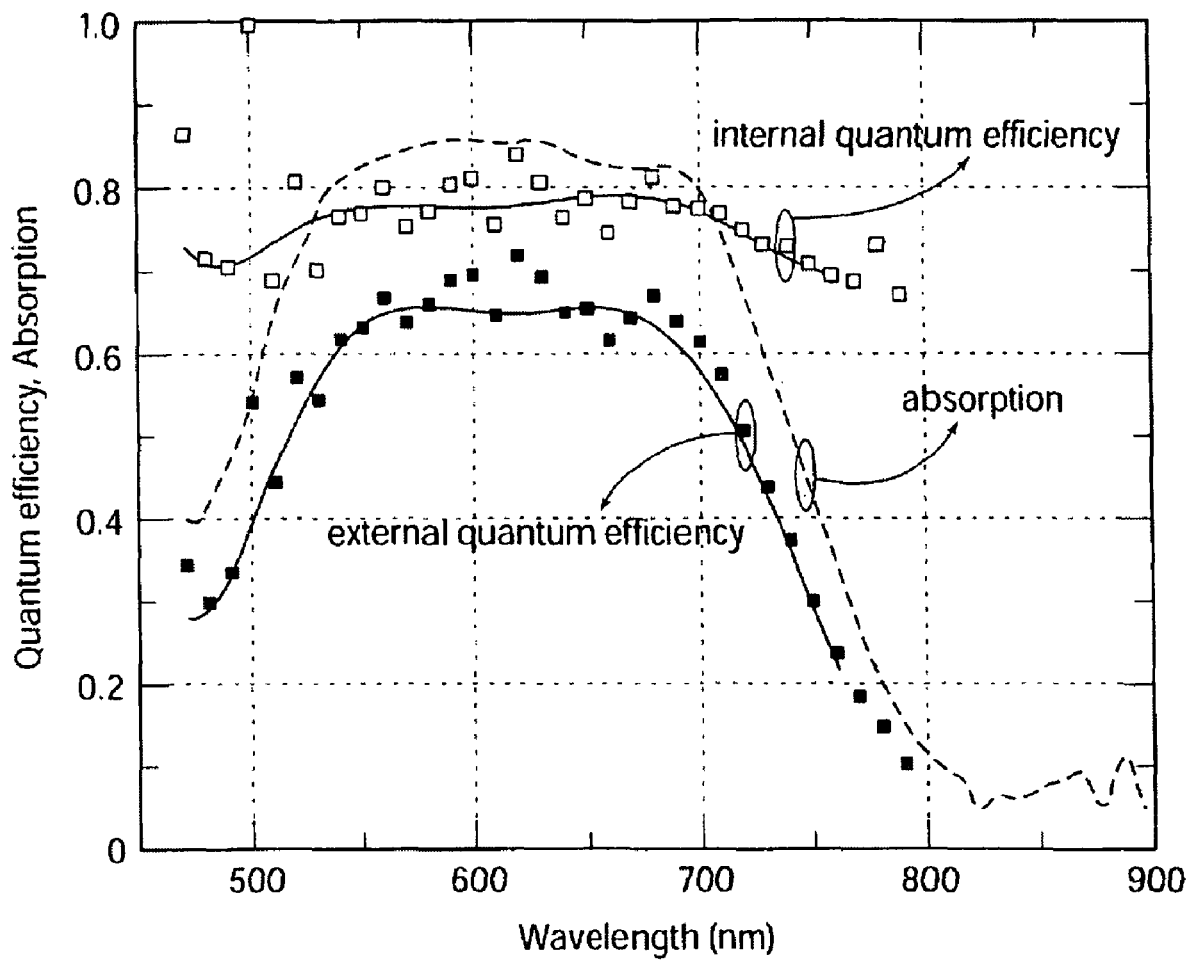
FIG. 22 is a plot of some efficiency and absorption data as a function of incident wavelength for a multilayer photodetector.
Figure 23:
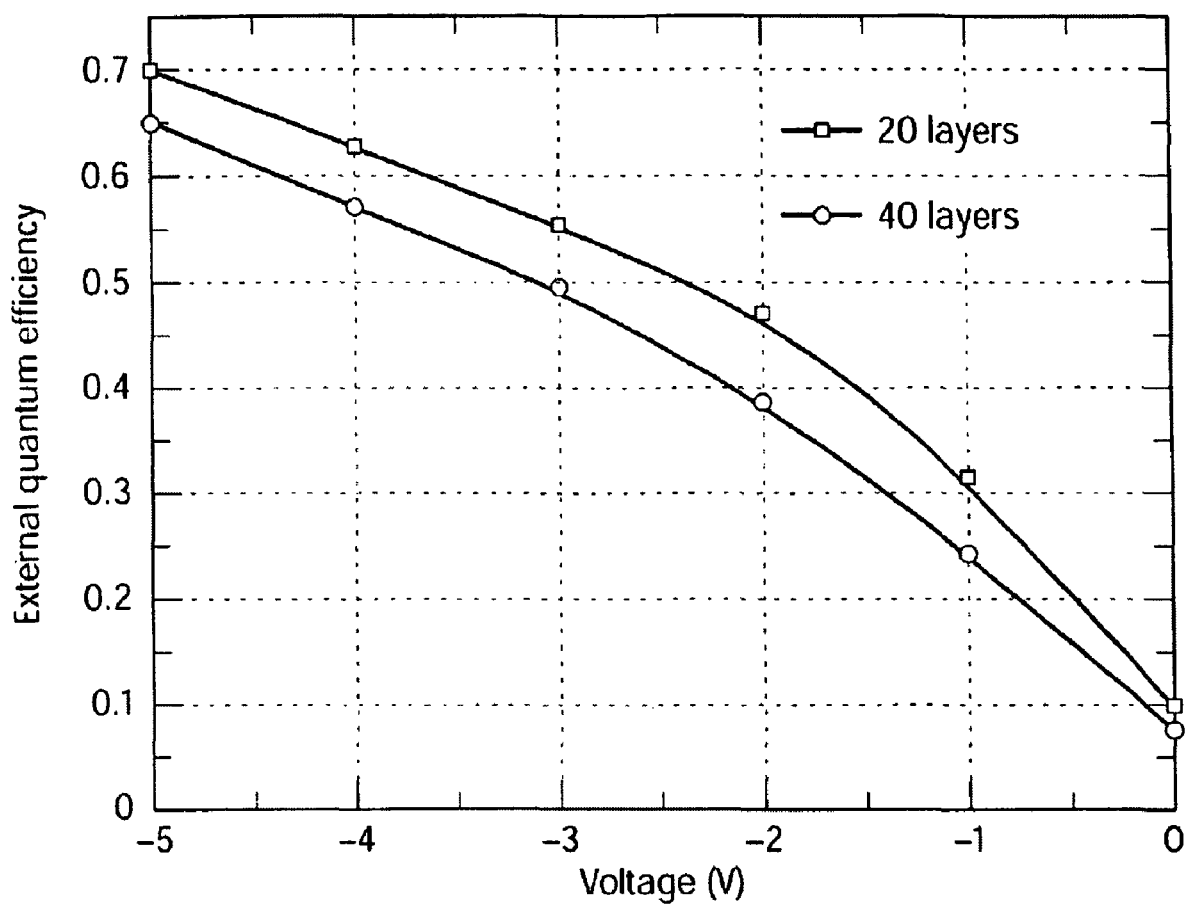
FIG. 23 is plot of external quantum efficiency as a function of voltage for some multilayer photodetectors.

FIGS. 21, 22, and 23 illustrate data from examples of a multilayer photodetector having an EBL. An HTL layer adjacent to an electrode and an ETL layer adjacent an electrode are typically thicker than the multiple pairs of HTL/ETL layers in the device interior away from electrodes. Typically then, the HTL layer adjacent to the cathode is about 30 to about 100 Å of CuPc. Similarly, the ETL layer, adjacent to the anode, is typically about 30 to about 100 Å of, e.g., PTCBI or $C_{60}$, and the EBL is, for example, about 50 to about 200 Å. The multiple pairs of HTL/ETL layers can have ETL and HTL layers having, e.g., a thickness of about 2 to about 10 Å, with the pairs repeated from 2 to 50 times.

FIG. 21 shows current-voltage for a multilayer photodetector and shows in this example that 20 HTL/ETL pairs produces a higher current response that 40 such interfaces. FIG. 22 shows quantum efficiency and absorption data for such multilayer photodetectors and illustrates a broad flat spectral response. FIG. 23 shows external quantum efficiency data for photodetectors having 20 or 40 HTL/ETL pairs, and that the 20 layer device has an improved external quantum efficiency. In the 20 and 40 pair photodetectors, the overall device thickness was not increased by the same factor as the number of pairs, i.e., 2 times, so the photosensitive layers forming the pairs were much thinner for the 40 pair device. It is believed that the current response and quantum efficiency were better for the 20 pair device, because the thinness of the HTL and ETL layers in the 40 pair device may have caused the layers to begin to lose their character as discrete layers. Instead it is believed that the materials forming the layers may have somewhat intermixed producing the somewhat poorer performance.

Synthesis

Examples processes for synthesizing exemplary EBL materials of the invention are provided below. These non-limiting examples are merely illustrative of preferred embodiments of the present invention, and are not to be construed as limiting the invention, the scope of which is defined by the appended claims.

2,4,7,9-tetraphenyl-1,10-phenanthroline (PBP)

Under a nitrogen atmosphere, 15 ml of a 1.6 mol/l phenyl-lithium solution (24 mmole) was added to a stirred suspension of 2.0 g of bathophenanthroline (6 mmole) in a mixture of 60 ml of toluene and 20 ml of THF, and the resulting mixture was cooled to 0° C. The resulting deep-red solution was stirred overnight at room temperature, and 10 ml of water was then added. The organic layer was separated, and the aqueous layer was extracted with 40 ml of dicholormethane three times. The combined extracts were stirred with 30 g of $MnO_2$ for 2 hours. The mixture was dried over 30 g of anhydrous $MgSO_4$, filtered, and evaporated to give 2.6 g of a light yellow solid in a yield of 90 percent. $^1$H NMR (500 MHz, $CDCl_3$), ppm: 8.50 (d, J=7.5 Hz, 4H), 8.09 (s, 2H), 7.81 (s, 2H), 7.61-7.57 (m, 8H), 7.55 (dd, J=7.5, 7.5 Hz, 4H), 7.52-7.47 (m, 4H). Analysis for PBP. Found: C, 88.62, H, 4.56, N, 5.82. Calculated: C, 89.23, H, 4.99, N, 5.78.

2,9-di-n-butyl-4,7-diphenyl-1,10-phenanthroline (n-BBP)

This yellow compound was prepared in a process analogous to the synthesis of PBP, and was obtained after running chromatography in a silica/$CH_2Cl_2$ column with a yield of 80 percent. $^1$H NMR (500 MHz, $CDCl_3$), ppm: 7.72 (s, 2H), 7.50 (d, J=4.7 Hz, 8H), 7.47 (dd, J=3.8, 7.5 Hz, 2H), 7.44 (s, 2H), 3.24 (t, J=8.2 Hz, 4H), 1.99-1.89 (m, 4H), 1.57-1.49 (m, 4H), 1.00 (dd, J=7.5, 7.5 Hz, 6H). Analysis for n-BBP. Found: C, 86.05, H, 7.18, N, 6.47. Calculated: C, 86.44, H, 7.25, N, 6.30.

2,9-di-t-butyl-4,7-diphenyl-1,10-phenanthroline (t-BBP)

This yellow compound was prepared in a process analogous to the synthesis of PBP, and was obtained after running chromatography in a silica/mixture of hexane/$CH_2Cl_2$ (1:1) column with a yield of 70 percent. $^1$H NMR (500 MHz, $CDCl_3$), ppm: 7.71 (s, 2H), 7.62 (s, 2H), 7.49 (s, 10H), 1.62 (s, 18H). Analysis for t-BBP. Found: C, 85.89, H, 7.40, N, 6.24. Calculated: C, 86.44, H, 7.25, N, 6.30.

2,4,7-triphenyl-1,10-phenanthroline (mono-PBP)

This yellow compound was prepared in a process analogous to the synthesis of PBP in which 2 equivalents of phenyllithium were used for each equivalent of bathophenanthroline. The clean product was obtained after running chromatography in a silica/mixture of methanol/$CH_2Cl_2$ (1:1) column with a yield of 75 percent. $^1$H NMR (500 MHz, $CDCl_3$), ppm: 9.26 (d, J=7.7 Hz, 1H), 8.37 (d, J=7.0 Hz, 2H), 8.04 (s, 1H), 7.82 (m, 2H), 7.59-7.45 (m, 14H). Analysis for mono-PBP.⅛$CH_2Cl_2$. Found: C, 86.10, H, 4.50, N, 6.79. Calculated: C, 86.33, H, 4.87, N, 6.68.

2-t-butyl-4,7-diphenyl-1,10-phenanthroline (mono-t-BBP)

This yellow compound was prepared in a process analogous to the synthesis of PBP in which 2 equivalents of t-butyllithium were used for each equivalent of bathophenanthroline. The clean product was obtained after running chromatography in a silica/mixture of methanol/$CH_2Cl_2$ (1:1) column with a yield of 70 percent. $^1$H NMR (500 MHz, $CDCl_3$) ppm: 9.28 (m, 1H), 7.81-7.74 (m, 2H), 7.68 (s, 1H), 7.57-7.35 (m, 11H), 1.62 (s, 9H). Analysis for mono-t-BBP. Found: C, 86.19, H, 6.18, N, 7.19. Calculated: C, 86.56, H, 6.25, N, 7.21.

4,7-diphenyl-2,9-di-m-tolyl-1,10-phenanthroline (m-TBP)

Under a nitrogen atmosphere, 8.8 ml of a 1.7 mol/l t-butyllithium solution (15 mmole) was added dropwise to a solution of 2.55 g of 2-bromo-toluence in 20 ml of THF at 0° C. The resulting mixture was stirred for another 2 hours, and then transferred to a stirred suspension of 1.0 g of bathophenanthroline (3 mmole) in 40 ml of toluene in an ice bath. The resulting deep-red solution was stirred overnight at room temperature, and 10 ml of water was then added. The organic layer was separated, and the aqueous layer was extracted with 30 ml of dicholormethane three times. The combined extracts were stirred with 15 g $MnO_2$ for 2 hours. The mixture then was dried over 15 g of anhydrous $MgSO_4$, filtered, and evaporated to dryness. The clean product was obtained after running chromatography in a silica/$CH_2Cl_2$ column with a yield of 75 percent. $^1$H NMR (500 MHz, $CDCl_3$), ppm: 8.50 (s, 2H), 8.22 (d, J=7.5 Hz, 2H), 8.09 (s, 2H), 7.80 (s, 2H), 7.63-7.48 (m, 10H), 7.45 (dd, J=7.0, 7.0 Hz, 2H), 7.31 (d, J=7.0 Hz, 2H), 2.54 (s, 6H). Analysis for m-TBP. Found: C, 88.29, H, 5.40, N, 5.57. Calculated: C, 89.03, H, 5.51, N, 5.46.

4,7-diphenyl-2,9-di-o-tolyl-1,10-phenanthroline (o-TBP)

This yellow compound was prepared in a process analogous to the synthesis of m-TBP. However, the reaction product consisted of mono-substituted and di-substituted bathophenanthroline. O-TBP was obtained after running chromatography in a silica/mixture of methanol/$CH_2Cl_2$ (1:1) column as the first eluent in a 20 percent yield. Mono-o-TBP was obtained as the second eluent in a 50 percent yield. $^1$H NMR (500 MHz, $CDCl_3$), ppm: 7.97 (s, 2H), 7.85 (s, 2H), 7.77 (s, 2H), 7.64-7.59 (m, 4H), 7.95-7.50 (m, 6H), 7.35 (m, 6H), 2.65 (s, 6H). Analysis for o-TBP.⅛$CH_2Cl_2$. Found: C, 87.03, H, 5.41, N, 5.23. Calculated: C, 87.51, H, 5.44, N, 5.35.

4,7-diphenyl-2-o-tolyl-1,10-phenanthroline (mono-o-TBP)

$^1$H NMR (500 MHz, $CDCl_3$), ppm: 9.23 (d, J=4.2 Hz, 1H), 7.87 (dd, J=9.4, 22.1 Hz, 2H), 7.71 (s, 1H), 7.67-7.64 (m, 1H), 7.57-7.45 (m, 11H), 7.32 (m, 3H), 2.52 (s, 3H). Analysis for mono-o-TBP. Found: C, 87.57, H, 5.26, N, 6.63. Calculated: C, 88.12, H, 5.25, N, 6.63.

4,7-diphenyl-2-xylenyl-1,10-phenanthroline (mono-XYBP)

This yellow compound was prepared in a process analogous to the synthesis of m-TBP. The product was obtained after running chromatography in a silica/mixture of methanol/$CH_2Cl_2$ (1:1) column with a yield of 50 percent. $^1$H NMR (500 MHz, $CDCl_3$), ppm: 9.24 (d, J=4.2 Hz, 1H), 7.89 (dd, J=9.4, 33.3 Hz, 2H), 7.58-7.45 (m, 12H), 7.20 (dd, J=8.0 Hz, 1H), 7.11 (d, J=7.51 Hz, 2H), 2.17 (s, 6H). Analysis for mono-XYBP.$CH_2Cl_2$. Found: C, 86.74, H, 5.15, N, 6.35. Calculated: C, 86.29, H, 5.47, N, 6.26.

2,4,7-triphenyl-9-o-tolyl-1,10-phenanthroline [P(o-T)BP]

This yellow compound was prepared in a process analogous to the synthesis of PBP in which 2 equivalents of phenyllithium reagent were used for each equivalent of mono-o-TBP. The clean product was obtained after running chromatography in a silica/mixture of methanol/$CH_2Cl_2$ (1:1) column with a yield of 50 percent. $^1$H NMR (500 MHz, $CDCl_3$), ppm: 8.40 (d, J=7.0 Hz, 2H), 8.06 (s, 1H), 7.88-7.80 (m, 2H), 7.79 (s, 1H), 7.76-7.73 (m, 1H), 7.60-7.48 (m, 12H), 7.45 (d, J=7.0 Hz, 1H), 7.41-7.38 (m, 1H), 7.37-7.33 (m, 2H), 2.84 (s, 3H). Analysis for [P(o-T)BP].$CH_2Cl_2$. Found: C, 87.19, H, 5.21, N, 5.48. Calculated: C, 87.56, H, 5.20, N, 5.50.

Thus, there has been described and illustrated herein an organic photosensitive optoelectronic device and method for producing the same. While it is apparent that the invention disclosed herein is well calculated to fulfill the objects stated above, it will be appreciated that numerous modifications and embodiments may be devised by those skilled in the art. Therefore, it is intended that the appended claims cover all such modifications and embodiments as falling within the true spirit and scope of the present invention.

What is claimed is:

1. An organic photosensitive optoelectronic device, comprising an anode, a cathode, and an organic blocking layer between the anode and the cathode, wherein the blocking layer comprises a phenanthroline derivative of formula

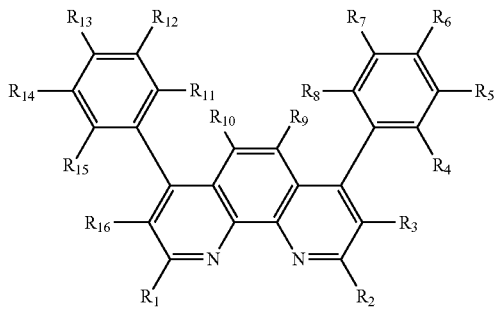

wherein $R_1$ to $R_{16}$ are hydrogen, alkyl, phenyl, or substituted phenyl, with the proviso that $R_1$ and $R_2$ are not both hydrogen and are not both methyl when $R_3$ to $R_{16}$ are all hydrogen, and at least partially blocks at least one of excitons, electrons, and holes, wherein said optoelectronic device is configured to generate an electrical current in response to incident electromagnetic radiation.

2. The organic photosensitive optoelectronic device of claim 1, wherein the phenanthroline derivative is selected from the group consisting of mono-t-BBP, mono-PBP, mono-o-TBP, mono-XYBP, n-BBP, t-BBP, PBP, o-TBP, m-TBP, and P(o-T)BP.

3. The organic photosensitive optoelectronic device of claim 1, wherein the blocking layer is an exciton blocking layer (EBL).

4. The organic photosensitive optoelectronic device of claim 3, wherein the device comprises stacked organic photosensitive optoelectronic devices.

5. The organic photosensitive optoelectronic device of claim 3, wherein the exciton blocking layer is adjacent to the anode or the cathode.

6. The organic photosensitive optoelectronic device of claim 1, wherein the device is a solar spectrum photodetector.

7. The organic photosensitive optoelectronic device of claim 6, wherein the device is a visible spectrum photodetector.

8. The organic photosensitive optoelectronic device of claim 1, further comprising a photosensitive heterostructure.

9. The organic photosensitive optoelectronic device of claim 8, wherein the photosensitive heterostructure comprises a donor/acceptor heterojunction.

10. The organic photosensitive optoelectronic device of claim 8, wherein the exciton blocking layer is positioned between the photosensitive heterostructure and one of the anode and the cathode.

11. The organic photosensitive optoelectronic device of claim 1, further comprising a photosensitive heterostructure, a first exciton blocking layer between the photosensitive heterostructure and the anode, and a second exciton blocking layer between the photosensitive heterostructure and the cathode.

12. The organic photosensitive optoelectronic device of claim 1, comprising a first exciton blocking layer adjacent to the anode and a second exciton blocking layer adjacent to the cathode.

13. The organic photosensitive optoelectronic device of claim 1, wherein the device comprises an electron transport layer (ETL), and the blocking layer is positioned between the ETL and one of the anode and the cathode.

14. The organic photosensitive optoelectronic device of claim 13, wherein the blocking layer is positioned between the ETL and the cathode, and the device further comprises a hole transport layer (HTL) between the anode and the ETL.

15. The organic photosensitive optoelectronic device of claim 14, wherein the blocking layer is an exciton blocking layer.

16. The organic photosensitive optoelectronic device of claim 13, wherein the ETL comprises $C_{60}$.

17. The organic photosensitive optoelectronic device of claim 1, wherein the phenanthroline derivative is asymmetric.

18. The organic photosensitive optoelectronic device of claim 1, wherein an electron transport layer, a hole transport layer, and the blocking layer are disposed between two parallel planar reflective surfaces, which form a waveguide.

19. The organic photosensitive optoelectronic device of claim 18, wherein one of the two reflective surfaces has an aperture to admit light incident upon the device.

20. The organic photosensitive optoelectronic device of claim 18, further comprising a transparent portion between the two reflective surfaces, such that light is admitted to the device from a direction substantially parallel to the planes of the reflective surfaces.

21. A stacked organic photosensitive optoelectronic device, comprising a plurality of the organic photosensitive optoelectronic device of claim 1.

* * * * *